(12) United States Patent
Liao et al.

(10) Patent No.: US 12,720,844 B2
(45) Date of Patent: Aug. 25, 2026

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Ta-Chuan Liao, Taichung City (TW); Chen-Liang Chu, Hsin-Chu City (TW); Hsin-Chih Chiang, Hsinchu City (TW); Ming-Ta Lei, Hsin-Chu City (TW); Ta-Yuan Kung, New Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 555 days.

(21) Appl. No.: 18/314,908

(22) Filed: May 10, 2023

(65) Prior Publication Data

US 2024/0379791 A1 Nov. 14, 2024

(51) Int. Cl.

| | |
|---|---|
| ***H10D 64/27*** | (2025.01) |
| ***H10D 30/60*** | (2025.01) |
| ***H10D 64/01*** | (2025.01) |
| ***H10W 20/00*** | (2026.01) |
| ***H10W 20/41*** | (2026.01) |

(52) U.S. Cl.

CPC ........... *H10D 64/519* (2025.01); *H10D 30/60* (2025.01); *H10D 64/017* (2025.01); *H10D 64/514* (2025.01); *H10D 64/518* (2025.01); *H10W 20/435* (2026.01)

(58) Field of Classification Search

CPC ............... H10D 64/519; H10D 64/017; H10D 30/0273; H10D 30/0614; H10D 30/60; H01L 21/79897

See application file for complete search history.

(56) References Cited

U.S. PATENT DOCUMENTS

| | | | | |
|---|---|---|---|---|
| 2017/0200798 | A1* | 7/2017 | Chen | H10D 84/038 |
| 2020/0058794 | A1* | 2/2020 | Wang | H01L 23/535 |
| 2021/0202734 | A1* | 7/2021 | Tsai | H01L 21/02362 |

* cited by examiner

*Primary Examiner* — Monica D Harrison
*Assistant Examiner* — Jacob T Nelson
(74) *Attorney, Agent, or Firm* — WPAT LAW; Anthony King

(57) ABSTRACT

A semiconductor structure includes semiconductor structure includes a metal gate structure, a plurality of dielectric pillars disposed in the metal gate structure, a source/drain structure disposed at tow side of the metal gate structure, and at least a first connecting structure disposed over one of the dielectric pillars and coupled to the metal gate structure. The first connecting structure overlaps the one of the dielectric pillars entirely from a top view. An area of the first connecting structure is greater than an area of the one of the dielectric pillars from the top view.

20 Claims, 22 Drawing Sheets

140
126
124
122
120
104
130
134
132
102
110
114
138
112
136
D2
D1
100a
I
I'

138
126
124
122
104
120
130
134
132
140
110
102
114
112
134
132
136
D2
D1

100b
114
120
130
I'
I
110
118
140
D1
D2

142
140
144
126
124
120
122
104
102
110
112
134
132
136
138
114
D1
D2

120
126
124
122
104
130
134
132
102
110
114
138
112
136
D2
D1

139-1
139-2
126
124
122
120
104
102
130
132
134
110
112
114
138
136
D1
D2

139

141
126
124
122
120
104
102
130
132
134
110
138
112
134
132
136
114
D2
D1

140
142
144
126
124
122
120
104
102
134
132
130
110
138
112
134
132
136
114
D2
D1

140
126
124
122
120
104
102
134
132
130
110
138
112
134
132
136
114
D2
D1

SEMICONDUCTOR STRUCTURE AND METHOD FOR FORMING THE SAME

BACKGROUND

The electronics industry has experienced an ever-increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far these goals have been achieved in large part by scaling down semiconductor IC dimensions (e.g., minimum feature size) and thereby improving production efficiency and reducing associated costs. However, such downscaling has also introduced increased complexity to the semiconductor manufacturing process.

As technology nodes achieve progressively smaller scales, in some IC designs, researchers have hoped to replace a typical polysilicon gate with a metal gate to improve device performance by decreasing the feature sizes. One approach to forming the metal gate is called a "gate-last" approach, sometimes referred to as a replacement polysilicon gate (RPG) approach. In the RPG approach, the metal gate is fabricated last, which allows for a reduced number of subsequent operations.

Further, as the dimensions of a transistor decrease, a thickness of a gate dielectric layer may be reduced to maintain performance with a decreased gate length. In order to reduce gate leakage, a high dielectric constant (high-k or HK) gate dielectric layer is used to provide a performance comparable to that provided by a typical gate oxide used in larger technology nodes. A high-k metal gate (HKMG) approach including a metal gate electrode and the high-k gate dielectric layer is therefore recognized. However, the HKMG approach is a complicated approach, and many issues arise.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
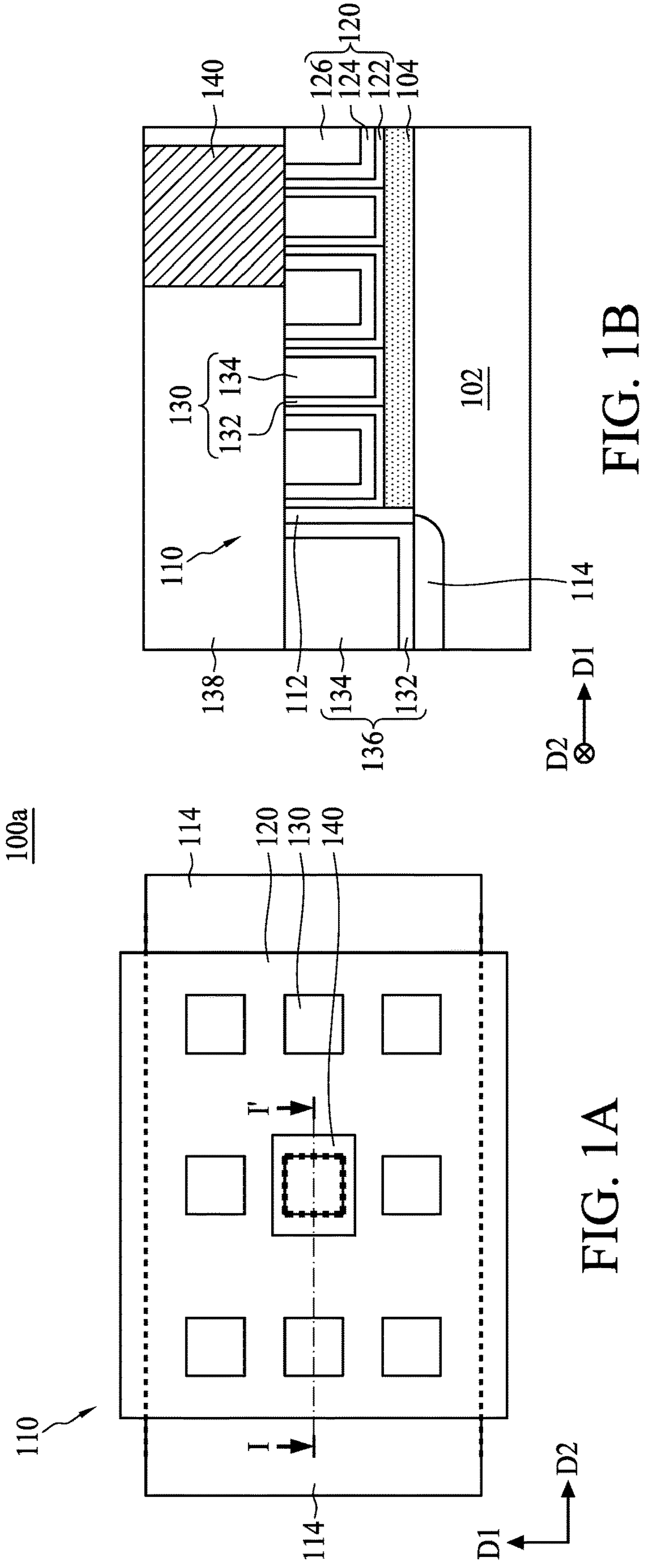
FIG. 1A is a top view of a semiconductor structure according to aspects of the present disclosure in one or more embodiments.
FIGS. 1B to 1D are cross-sectional views taken along a line I-I' of FIG. 1A.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With ongoing down-scaling of integrated circuits, power supply voltages of the integrated circuits may be reduced. However, the voltage reductions may be different in different circuits or regions. For example, memory circuits and core circuits may have threshold voltage (Vt) requirements different from those of driver circuits. A multiple-Vt capability may be formed for device design.

Further, as gate length (Lg) scale is reduced in advanced nodes, realizing the multiple-Vt capability using different gate schemes becomes challenging. For example, in some comparative approaches, an HKMG process is used in multiple-Vt designs. In such approaches, a metal gate structure with a greater gate length is provided for a high-voltage (HV) device in a driver circuit, while a metal gate structure with a smaller gate length is provided for a low-voltage (LV) device in a core or a memory circuit. Further, dielectric pillars may be formed in the metal gate structure of an HV device in order to mitigate a dishing issue that occurs during a planarization in the HKMG process.

However, it is found that a drive current of the HV device having the dielectric pillars in the metal gate structure suffers from drive current loss. In some comparative approaches, such current loss is obvious in an HK-last process in the HKMG process. In such approaches, a drive current loss may be 15%, which adversely impacts device performance.

Embodiments of a method for forming a semiconductor structure are therefore provided. The semiconductor structure is formed via an HKMG process with multiple-Vt designs. The semiconductor structure can be formed in a planar device process according to some embodiments. Further, the semiconductor structure can be integrated in a non-planar device in some embodiments. In some embodiments, the method for forming the semiconductor structure includes providing connecting structures over a metal gate structure or in a metal gate structure of an HV device. In some embodiments, the HV device may be formed by HK-last processes, and thus the metal gate structure may have a discontinuous configuration. However, the connecting structure over or in the metal gate structure removes such discontinuity. Accordingly, the drive current loss issue is mitigated.

Figures 1C, 1D:
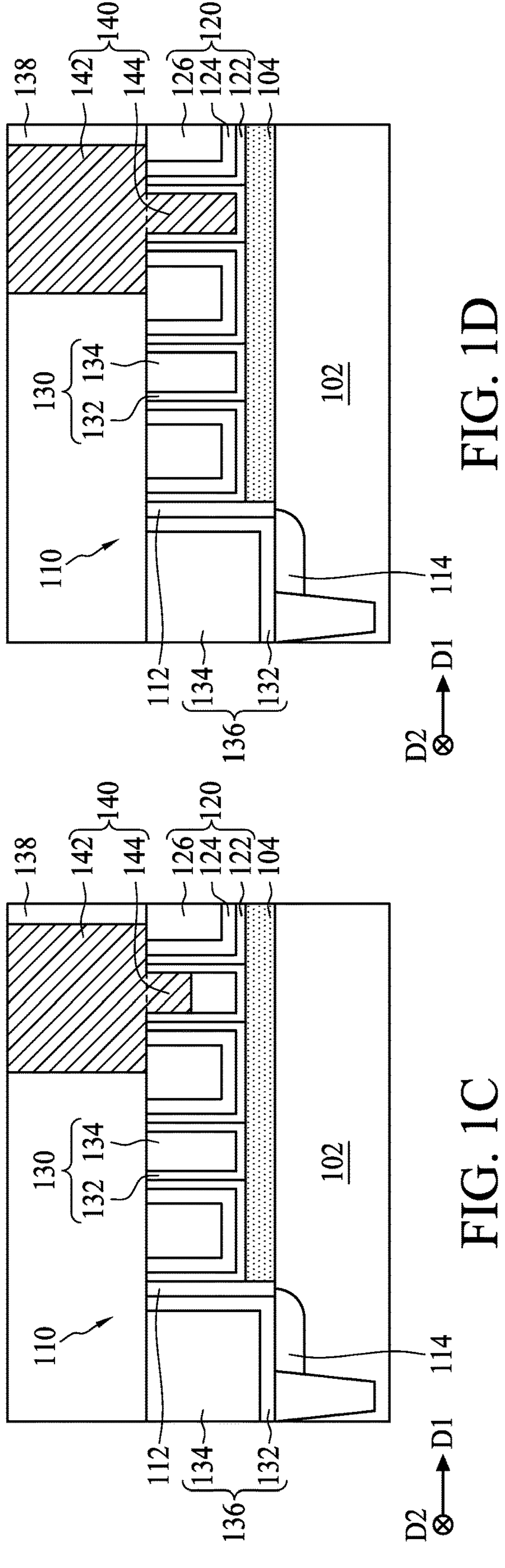

Please refer to FIGS. 1A to 1D, wherein FIG. 1A is a top view of a semiconductor structure according to aspects of the present disclosure in one or more embodiments, and FIGS. 1B to 1D are cross-sectional views taken along a line I-I' of FIG. 1A. In some embodiments, a semiconductor structure 100*a* is provided. The semiconductor structure 100*a* includes a substrate 102, and a transistor device 110 disposed over the substrate 102. The transistor device 110 includes a metal gate structure 120, a spacer 112 over sidewalls of the metal gate structure 120, and a source/drain structure 114. The source/drain structure 114 may refer to a source or a drain, individually or collectively depending on context. Further, the semiconductor structure 100*a* includes a plurality of dielectric pillars 130 disposed in the metal gate structure 120.

In some embodiments, the substrate 102 may be a semiconductor substrate such as a silicon substrate. The substrate 102 may also include other semiconductors such as germanium (Ge), silicon carbide (SiC), silicon germanium (SiGe), or diamond. Alternatively, the substrate 102 may include a compound semiconductor and/or an alloy semiconductor. The substrate 102 may include various doping configurations depending on design requirements, as is known in the art. For example, different doping profiles (e.g., n wells or p wells) may be formed on the substrate 102 in regions designed for different device types (e.g., n-type field-effect transistors (NFET), or p-type field-effect transistors (PFET)). A suitable doping may include ion implantation of dopants and/or diffusion processes.

In some embodiments, the substrate 102 may include regions separated from each other by isolation structures, e.g., shallow trench isolation (STI) structures (not shown). The various regions may be defined for accommodating different devices. For example, one region may accommodate an HV device, and another region may accommodate an LV device. In some embodiments, the HV device has an operating voltage greater than that of the LV device. It should be noted that the operating voltages can vary for different applications; thus they are not limited herein. In some embodiments, the HV device and the LV device may be planar transistors or multi-gate transistors, such as fin-like FETs (FinFETs).

Additionally, the isolation structures are formed in the substrate 102 for various purposes. For example, the isolation structure with a greater depth may be formed in the region accommodating the HV device.

In some embodiments, a dielectric layer 104 may be formed over the substrate 102. In such embodiments, the metal gate structure 120 and the spacer 112 are separated from the substrate 102 by the dielectric layer 104. In some embodiments, the dielectric layer 104 includes oxide, but the disclosure is not limited thereto.

In some embodiments, the metal gate structure 120 of the transistor device 110 includes a multilayered structure. For example, the metal gate structure 120 may include at least a high-k gate dielectric layer 122, a work function metal layer 124 and a gap-filling metal layer 126. In some embodiments, the high-k gate dielectric layer 122 may be in contact with the dielectric layer 104. The high-k gate dielectric layer 122 includes a high-k dielectric material having a high dielectric constant, for example, a dielectric constant greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof. Further, as shown in FIGS. 1B to 1D, the high-k gate dielectric layer 122 has a U shape. Additionally, the U-shaped high-k gate dielectric layer 122 is omitted from FIG. 1A for clarity.

The work function metal layer 124 is formed over the high-k gate dielectric layer 122. Further, the work function metal layer 124 of the metal gate structure 120 has a U shape. Additionally, the U-shaped work function metal layer 124 is omitted from FIG. 1A for clarity. The work function metal layer 124 may include n-type work function metal or p-type work function metal, depending on product requirements. In some embodiments, the work function metal layer 124 may include a single layer. In some alternative embodiments, the work function metal layer 124 may include a multilayered structure. The gap-filling metal layer 126 is formed over the work function metal layer 124. In some embodiments, the gap-filling metal layer 126 can include conductive material such as Al, Cu, AlCu or W, but is not limited to such materials.

In some embodiments, the plurality of dielectric pillars 130 are disposed in the metal gate structure 120. As shown in FIG. 1A, the dielectric pillars 130 may be periodically arranged along a first direction D1 and a second direction D2, and thus form a column-and-row array. Accordingly, the metal gate structure 120 has a grid pattern. However, the arrangement of the dielectric pillars 130 is not limited thereto. For example, in other embodiments, the dielectric pillars 130 may be randomly arranged. In some embodiments, the dielectric pillars 130 are in contact with the dielectric layer 104; thus, the metal gate structure 120 may have a discontinuous configuration due to the dielectric pillars 130. In some embodiments, the dielectric pillars 130 include two dielectric layers: a first dielectric layer 132 and a second dielectric layer 134, as shown in FIGS. 1B to 1D. The first dielectric layer 132 may include silicon nitride, silicon oxynitride, and/or other applicable materials. Further, the first dielectric layer 132 may have a U shape. The second dielectric layer 134 may include a single layer made of oxide, or include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bis-benzocyclobutenes (BCB), and polyimide. As shown in FIGS. 1B to 1D, the U-shaped first dielectric layer 132 is in contact with sidewalls and a bottom of the second dielectric layer 134. Further, a topmost surface of the U-shaped first dielectric layer 132, a top surface of the second dielectric layer 134, and a top surface of the metal gate structure 120 are aligned (i.e., coplanar) with each other.

The spacers 112 are formed over the sidewalls of the metal gate structure 120. In some embodiments, the spacers 112 include multiple layers, but the disclosure is not limited thereto. In some embodiments, the spacers 112 are made of silicon nitride (SiN), silicon carbide (SiC), silicon oxide (SiOx), silicon oxynitride (SiON), silicon carbide or any other suitable material, but the disclosure is not limited thereto. In some embodiments, the spacers 112 are formed by deposition and etch-back operations.

The source/drain structure 114 is formed in the substrate 102 at two sides of the metal gate structure 120. In some embodiments, tops of the source/drain structure 114 may be higher than a top surface of the substrate 102. In such embodiments, a lattice constant of a strained material may be different from a lattice constant of the substrate 102. Accordingly, the source/drain structure 114 may serve as stressors that improve carrier mobility.

In some embodiments, a first dielectric structure 136 is disposed over the substrate 102, and the transistor device 110 is embedded in the first dielectric structure 136. In some embodiments, the first dielectric structure 136 and the dielectric pillars 130 include a same configuration. In such embodiments, the first dielectric structure 136 includes the first dielectric layer 132 serving as a contact etch stop layer (CESL), and the second dielectric layer 134 serving as an inter-layer dielectric (ILD) layer.

In some embodiments, the semiconductor structure 100*a* further includes a second dielectric structure 138 disposed over the first dielectric structure 136 and the transistor device 110. In some embodiments, the second dielectric structure 138 may be a multiple-layered structure. In some embodiments, the second dielectric structure 138 may include multilayers made of multiple dielectric materials, such as silicon oxide, silicon nitride, silicon oxynitride, TEOS, PSG, BPSG, low-k dielectric material, and/or other applicable dielectric materials. Examples of low-k dielectric materials include, but are not limited to, FSG, carbon-doped silicon oxide, amorphous fluorinated carbon, parylene, BCB, and polyimide.

The semiconductor structure 100*a* further includes a connecting structure 140 disposed in the second dielectric structure 138. Further, the connecting structure 140 is disposed over one of the dielectric pillars 130. In some embodiments, the connecting structure 140 may serve as a metal-to-gate connecting structure. In such embodiments, the connecting structure 140 may be formed by middle-end-of-line (MEOL) operations, but the disclosure is not limited thereto.

In some embodiments, the connecting structure 140 may be disposed over a central one of the dielectric pillars 130, as shown in FIG. 1A, but the disclosure is not limited thereto. As shown in FIG. 1A, the connecting structure 140 overlaps the dielectric pillar 130 entirely, from a top view. An area of the connecting structure 140 is greater than an area of the dielectric pillar 130 from the top view. In other words, a width of the connecting structure 140 is greater than a width of the dielectric pillar 130 from the cross-sectional view. In such embodiments, the connecting structure 140 has a portion overlapping the metal gate structure 120, and another portion overlapping the dielectric pillar 130.

In some embodiments, the connecting structure 140 has a flat bottom surface, as shown in FIG. 1B. In such embodiments, the bottom surface of the connecting structure 140 is in contact with the metal gate structure 120 and the dielectric pillar 130. Further, the bottom surface of the connecting structure 140 is in contact with the work function metal layer 124 and/or the gap-filling metal layer 126 of the metal gate structure 120.

In some embodiments, the connecting structure 140 has a first portion 142 and a second portion 144 under and coupled to the first portion 142, as shown in FIGS. 1C and 1D. A bottom surface of the second portion 144 is lower than the bottom surface of the first portion 142, as shown in FIG. 1C. Further, the bottom surface of the second portion 144 and a top surface of the dielectric pillar 130 are lower than a top surface of the metal gate structure 120. Accordingly, the bottom surface of the first portion 142 is in contact with the metal gate structure 120 (i.e., the work function metal layer 124 and/or the gap-filling metal layer 126), while the bottom surface of the second portion 144 is in contact with a top surface of the dielectric pillar 130.

In some embodiments, the second portion 144 may replace the second dielectric layer 134 of the dielectric pillar 130 entirely, as shown in FIG. 1D. In such embodiments, the first portion 142 of the connecting structure 140 is in contact with the metal gate structure 120 and the second portion 144, while the second portion 144 of the connecting structure 140 is in contact with the first dielectric layer 132 of the dielectric pillar 130.

Referring to FIGS. 1B to 1D, the discontinuity of the metal gate structure 120 caused by the dielectric pillars 130 is resolved by the connecting structure 140 bridging between the metal gate structures 120.

Additionally, as mentioned above, the second portion 144 may replace the second dielectric layer 134 of the dielectric pillar 130 entirely. In such embodiments, it may be said that the semiconductor structure 100*a* includes a conductive pillar 144 disposed in a center of the metal gate structure 120. In other words, the connecting structure 140 and the conductive pillar 144 are disposed in a center of the metal gate structure 120. In such embodiments, other dielectric pillars 130 may surround the conductive pillar 144 and the connecting structure 140 from the top view, as shown in FIG. 1D. Further, the conductive pillar 144 is surrounded by the metal gate structure 120 but separated from the metal gate structure 120 by the U-shaped first dielectric layer 132 of the dielectric pillar 130.

Additionally, the connecting structure 140 of the semiconductor structure 100*a* may be coupled to a back-end-of-line (BEOL) interconnect structure, though not shown.

Figures 2A, 2B:
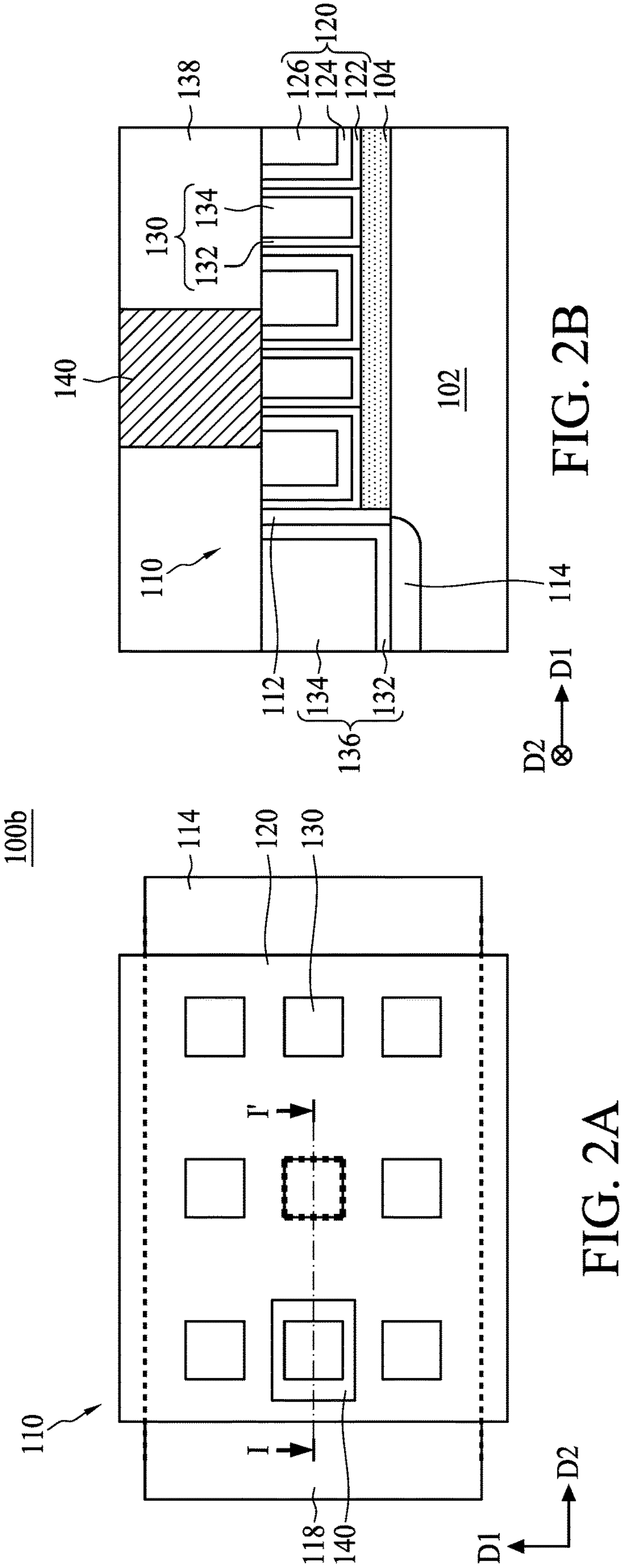
FIG. 2A is a top view of a semiconductor structure according to aspects of the present disclosure in one or more embodiments.
FIGS. 2B to 2D are cross-sectional views taken along a line I-I' of FIG. 2A.
Figures 2C, 2D:
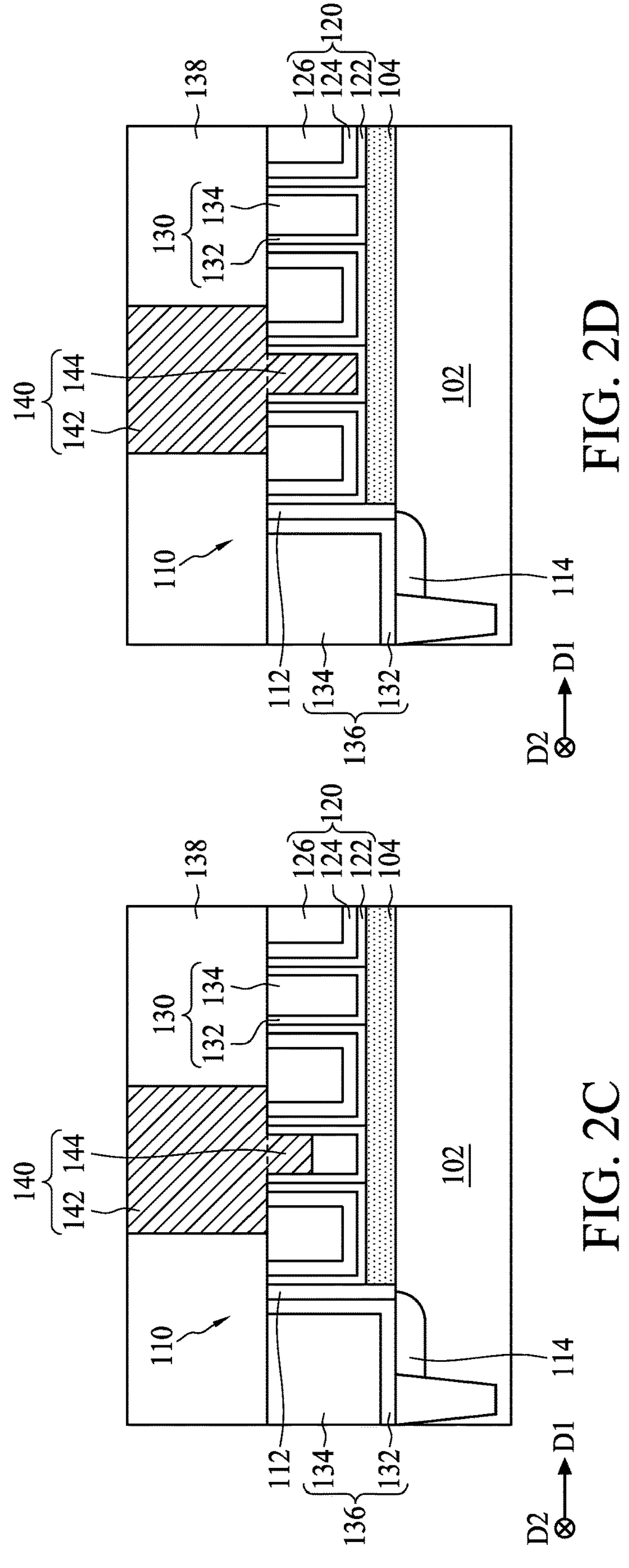

Please refer to FIGS. 2A to 2D, wherein FIG. 2A is a top view of a semiconductor structure according to aspects of the present disclosure in one or more embodiments, and FIGS. 2B to 2D are cross-sectional views taken along a line I-I' of FIG. 2A. In some embodiments, a semiconductor structure 100*b* is provided. The semiconductor structure 100*b* includes a substrate 102, a transistor device 110 disposed over the substrate 102, a first dielectric structure 136 disposed over the substrate 102 with the transistor device 110 embedded within the first dielectric structure 136, a second dielectric structure 138 over the first dielectric structure 136 and the transistor device 110, and at least a connecting structure 140 disposed in the second dielectric structure 138. As described above, in reference to FIGS. 1A to 1D, the transistor device 110 includes a metal gate structure 120, a spacer 112 over sidewalls of the metal gate structure 120, and a source/drain structure 114. Further, the semiconductor structure 100*b* includes a plurality of dielectric pillars 130 disposed in the metal gate structure 120. As described above, the dielectric pillars 130 are in contact with a dielectric layer 104; thus, the metal gate structure 120 has a discontinuous configuration due to the dielectric pillars 130. It should be noted that same elements in FIGS. 1A to 1D and 2A to 2D are designated by same numerals, and may include same materials; therefore, repeated descriptions are omitted for brevity.

Referring to FIGS. 2A to 2D, the connecting structure 140 is disposed over one of the dielectric pillars 130. In some embodiments, the connecting structure 140 may be disposed over a peripheral one of the dielectric pillars 130, as shown in FIG. 2A, but the disclosure is not limited thereto. The connecting structure 140 entirely overlaps the dielectric pillar 130 from a top view. An area of the connecting structure 140 is greater than an area of the dielectric pillar 130 from the top view, and a width of the connecting structure 140 is greater than a width of the dielectric pillar 130 from the cross-sectional view. In some embodiments, a portion of the connecting structure 140 overlaps the metal gate structure 120, and another portion of the connecting structure 140 overlaps the dielectric pillar 130. As described above, the connecting structure 140 has a flat surface that is in contact with the metal gate structure 120 and the dielectric pillar 130, as shown in FIG. 2B. Further, the bottom surface of the connecting structure 140 is in contact with a work function metal layer 124 and/or a gap-filling metal layer 126 of the metal gate structure 120.

In some embodiments, the connecting structure 140 has a first portion 142 and a second portion 144 under and coupled to the first portion 142, as shown in FIGS. 2C and 2D. A bottom surface of the second portion 144 is lower than a bottom surface of the first portion 142, as shown in FIG. 2C. Further, the bottom surface of the second portion 144 and a top surface of the dielectric pillar 130 are lower than a top surface of the metal gate structure 120. Accordingly, the bottom surface of the first portion 142 is in contact with the metal gate structure 120 (i.e., the work function metal layer 124 and/or the gap-filling metal layer 126), while the bottom surface of the second portion 144 is in contact with a top surface of the dielectric pillar 130.

In some embodiments, the second portion 144 may replace the second dielectric layer 134 of the dielectric pillar 130 entirely, as shown in FIG. 2D. In such embodiments, the first portion 142 of the connecting structure 140 is in contact with the metal gate structure 120 and the second portion 144 of the connecting structure 140, while the second portion 144 is in contact with a first dielectric layer 132 of the dielectric pillar 130.

Referring to FIGS. 2B to 2D, the discontinuity of the metal gate structure 120 caused by the dielectric pillars 130 is resolved by the connecting structure 140 bridging between the metal gate structures 120.

Additionally, as mentioned above, the second portion 144 may replace the second dielectric layer 134 of the dielectric pillar 130 entirely; in such embodiments, it may be said that the semiconductor structure 100*b* includes a conductive pillar 144 disposed in a center of the metal gate structure 120. In other words, the connecting structure 140 and the conductive pillar 144 are disposed in a periphery of the metal gate structure 120. Further, the conductive pillar 144 is surrounded by the metal gate structure 120 but separated from the metal gate structure 120 by the U-shaped first dielectric layer 132 of the dielectric pillar 130.

Additionally, the connecting structure 140 of the semiconductor structure 100*b* may be coupled to a BEOL interconnect structure, though not shown.

Figures 3A, 3B:
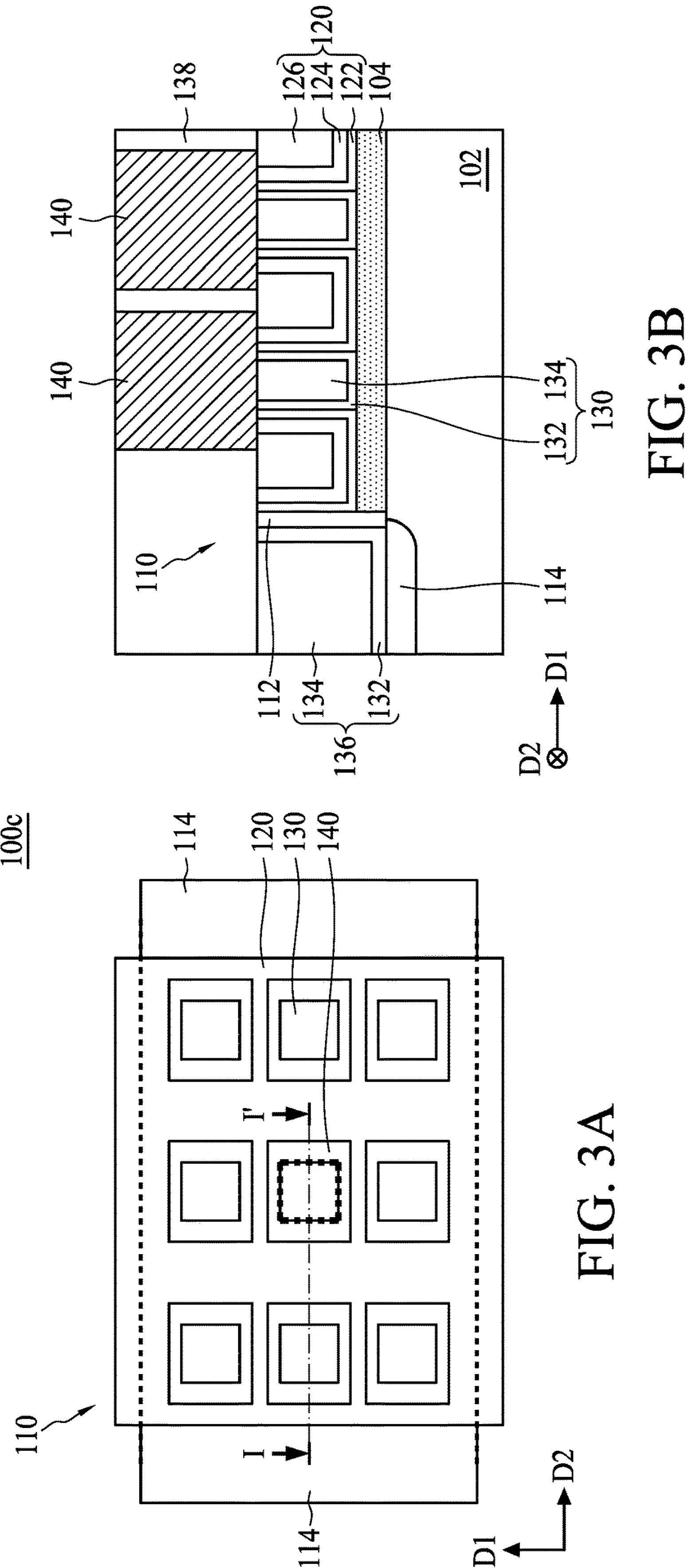
FIG. 3A is a top view of a semiconductor structure according to aspects of the present disclosure in one or more embodiments.
FIGS. 3B to 3D are cross-sectional views taken along a line I-I' of FIG. 3A.
Figures 3C, 3D:
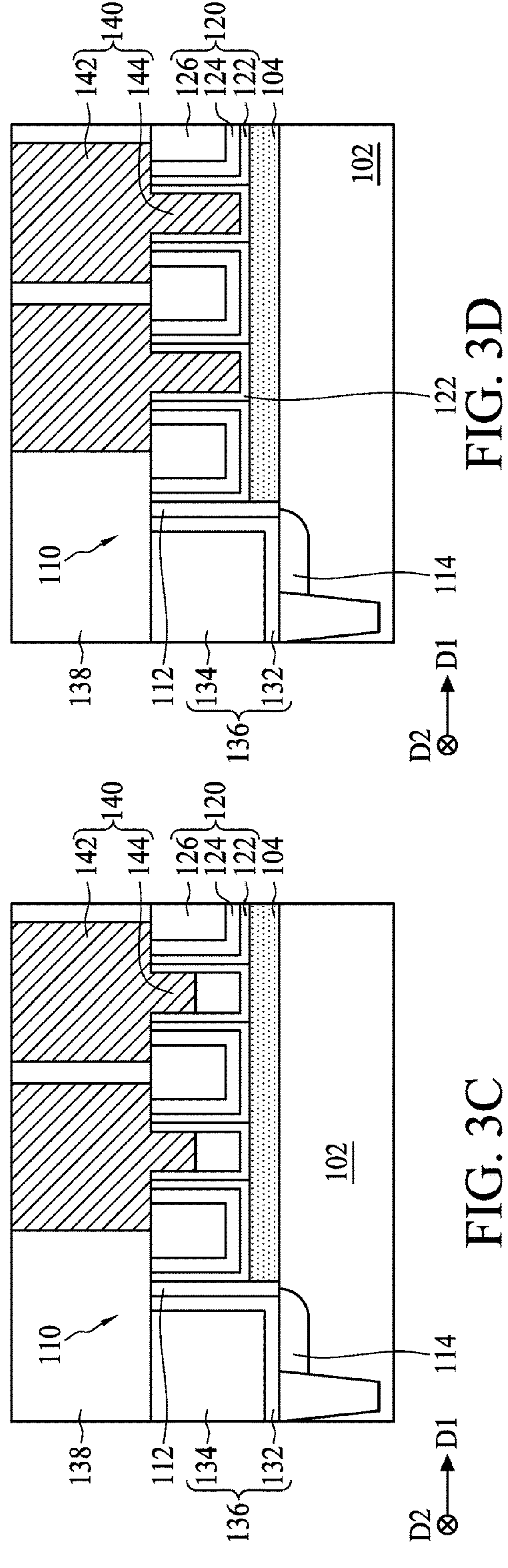

Please refer to FIGS. 3A to 3D, wherein FIG. 3A is a top view of a semiconductor structure according to aspects of the present disclosure in one or more embodiments, and FIGS. 3B to 3D are cross-sectional views taken along a line I-I' of FIG. 3A. In some embodiments, a semiconductor structure 100*c* is provided. It should be noted that same elements in FIGS. 1A to 1D and FIGS. 3A to 3D are designated by same numerals, and may include same materials; therefore, repeated descriptions are omitted for brevity. The semiconductor structure 100*c* includes a metal gate structure 120 and a plurality of dielectric pillars 130 disposed in the metal gate structure 120. As mentioned above, the dielectric pillars 130 cause a discontinuity of the metal gate structure 120. The semiconductor structure 100*c* further includes a plurality of connecting structures 140 disposed in a second dielectric structure 138.

Referring to FIG. 3A, each of the connecting structures 140 is disposed over one of the dielectric pillars 130. Further, each of the connecting structures 140 overlaps the dielectric pillar 130 entirely from a top view. An area of each connecting structure 140 is greater than an area of each dielectric pillar 130.

As mentioned above, a portion of the connecting structure 140 overlaps the metal gate structure 120, and another portion of the connecting structure 140 overlaps the dielectric pillar 130. As mentioned above, the connecting structure 140 has a flat surface that is in contact with the metal gate structure 120 and the dielectric pillar 130, as shown in FIG. 3B. Further, a bottom surface of the connecting structure 140 is in contact with a work function metal layer 124 and/or a gap-filling metal layer 126 of the metal gate structure 120.

In some embodiments, the connecting structure 140 has a first portion 142 and a second portion 144 under and coupled to the first portion 142, as shown in FIGS. 3C and 3D. A bottom surface of the second portion 144 is lower than a bottom surface of the first portion 142, as shown in FIG. 3C. Further, the bottom surface of the second portion 144 and a top surface of the dielectric pillar 130 are lower than a top surface of the metal gate structure 120. Accordingly, the bottom surface of the first portion 142 is in contact with the metal gate structure 120 (i.e., the work function metal layer 124 and/or the gap-filling metal layer 126), while the bottom surface of the second portion 144 is in contact with the top surface of the dielectric pillar 130.

In some embodiments, the second portion 144 may replace the second dielectric layer 134 of the dielectric pillar 130 entirely, as shown in FIG. 3D. In such embodiments, the first portion 142 of the connecting structure 140 is in contact with the metal gate structure 120 and the second portion 144 of the connecting structure 140, while the second portion 144 is in contact with the first dielectric layer 132 of the dielectric pillar 130. As mentioned above, the second portion 144 may be referred to as a conductive pillar 144. Further, the conductive pillar 144 is separated from the metal gate structure 120 by the first dielectric layer 132.

Referring to FIGS. 3B to 3D, the discontinuity of the metal gate structure 120 cause by the dielectric pillars 130 is resolved by the connecting structure 140 bridging between the metal gate structures 120.

In some embodiments, the connecting structures 140 may be coupled to a BEOL interconnect structure, though not shown. In some embodiments, some of the connecting structures 140 of the semiconductor structure 100*c* may be coupled to the BEOL interconnect structure, while others are electrically isolated from the BEOL interconnect structure, though not shown.

Figure 4:
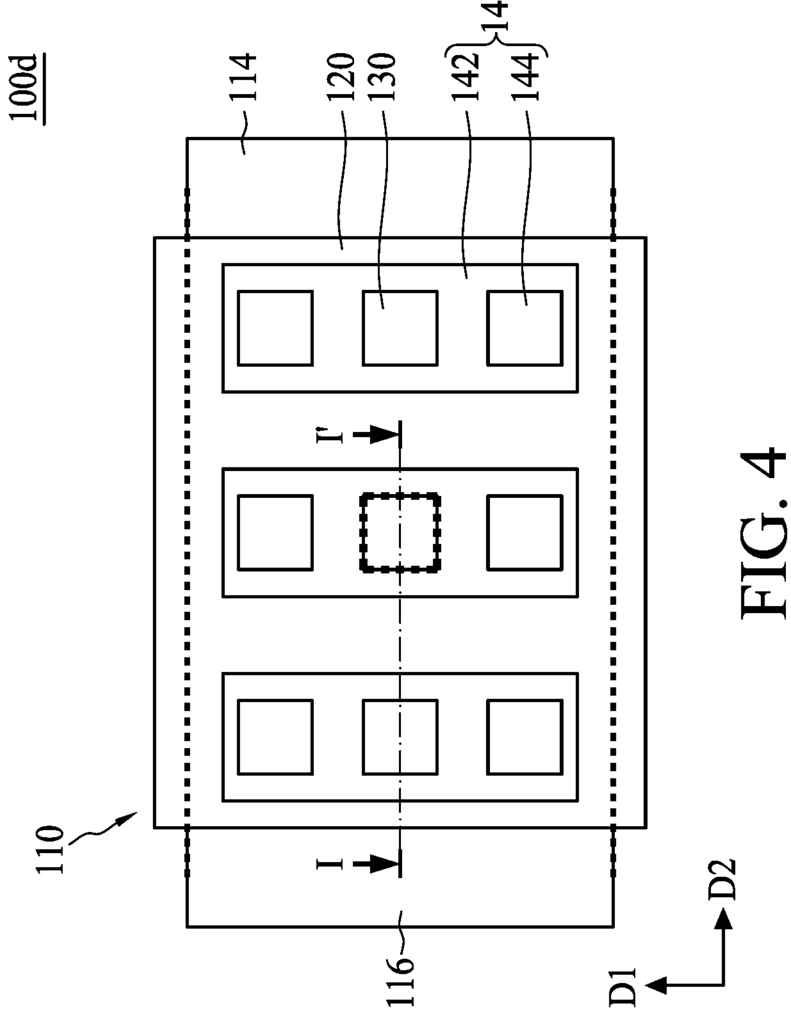
FIG. 4 is a top view of a semiconductor structure according to aspects of the present disclosure in one or more embodiments.

Referring to FIG. 4, which is a top view of a semiconductor structure according to aspects of the present disclosure in one or more embodiments, a semiconductor structure 100*d* is provided. It should be noted that same elements in FIGS. 1A to 1D and FIG. 4 are designated by same numerals, and may include same materials; therefore, repeated descriptions are omitted for brevity. In some embodiments, the semiconductor structure 100*e* includes a metal gate structure 120, and a plurality of dielectric pillars 130 disposed in the metal gate structure 120. As mentioned above, the dielectric pillars 130 cause a discontinuity of the metal gate structure 120. The semiconductor structure 100*e* further includes a plurality of connecting structures 140 disposed in a second dielectric structure.

In some embodiments, each of the connecting structures 140 is disposed over more than one of the dielectric pillars 130. For example, the connecting structure 140 may be disposed over three dielectric pillars 130, as shown in FIG. 4. Further, each of the connecting structures 140 overlaps the three dielectric pillars 130 entirely from a top view. An area of the connecting structure 140 is greater than an area of the dielectric pillars 130. The area of the connecting structure 140 is further greater than a sum of the areas of the three dielectric pillars 130. It should be noted that a quantity of the dielectric pillars 130 overlapped by the connecting structure 140 may be adjusted according to various product designs. Also, the arrangements of the connecting structures 140 can be modified according to various product designs.

In some embodiments, a portion of the connecting structure 140 overlaps the metal gate structure 120, and another portion of the connecting structure 140 overlaps the dielectric pillars 130. As mentioned above, the connecting structure 140 has a flat surface that is in contact with the metal gate structure 120 and the dielectric pillars 130; such configuration is similar to that shown in FIG. 3B.

In some embodiments, the connecting structure 140 has a first portion 142 overlapping the metal gate structure 120, and a second portion 144 overlapping the dielectric pillar 130. In such embodiments, bottom surfaces of the second portions 144 are lower than bottom surfaces of the first portions 142; such configuration is similar to that shown in FIG. 3C. Further, in some embodiments, the dielectric pillars 130 may be entirely replaced with a plurality of conductive pillars; such configuration is similar to that shown in FIG. 4B. The first portion 142 of the connecting structure 140 is coupled to the metal gate structure 120, and the second portion 144 of the connecting structure 140 is coupled to the dielectric pillars 130, as shown in FIGS. 3B, 3C and 3D. Accordingly, the discontinuity of the metal gate structure 120 is resolved by the connecting structures 140.

Additionally, in some embodiments, the second portion 144 of the connecting structure 140 as shown in FIGS. 1D, 2D and 3D is referred to as a conductive pillar. In such embodiments, the first portion 142 of the connecting structure 140 overlaps the conductive pillar entirely from the top view. An area of the first portion 142 of the connecting structure 140 is greater than an area of the conductive pillar 144 from the top view.

In some embodiments, the connecting structures 140 of the semiconductor device 100*e* may be coupled to a BEOL interconnect structure, though not shown. In some embodiments, some of the connecting structures 140 may be coupled to the BEOL interconnect structure, while others are electrically isolated from the BEOL interconnect structure.

Accordingly, the present disclosure provides semiconductor structures 100*a* to 100*d* including connecting structure(s) 140 coupling and connecting a metal gate structure 120. A discontinuity of the metal gate structure 120 caused by dielectric pillars 130 and/or a U-shaped first dielectric layer 132 is therefore resolved by the connecting structure 140. Consequently, a drive current loss issue may be mitigated by the connecting structure 140 from over 15% to less than 5%. In other words, device performance of a driver-IC is improved.

Figure 5:
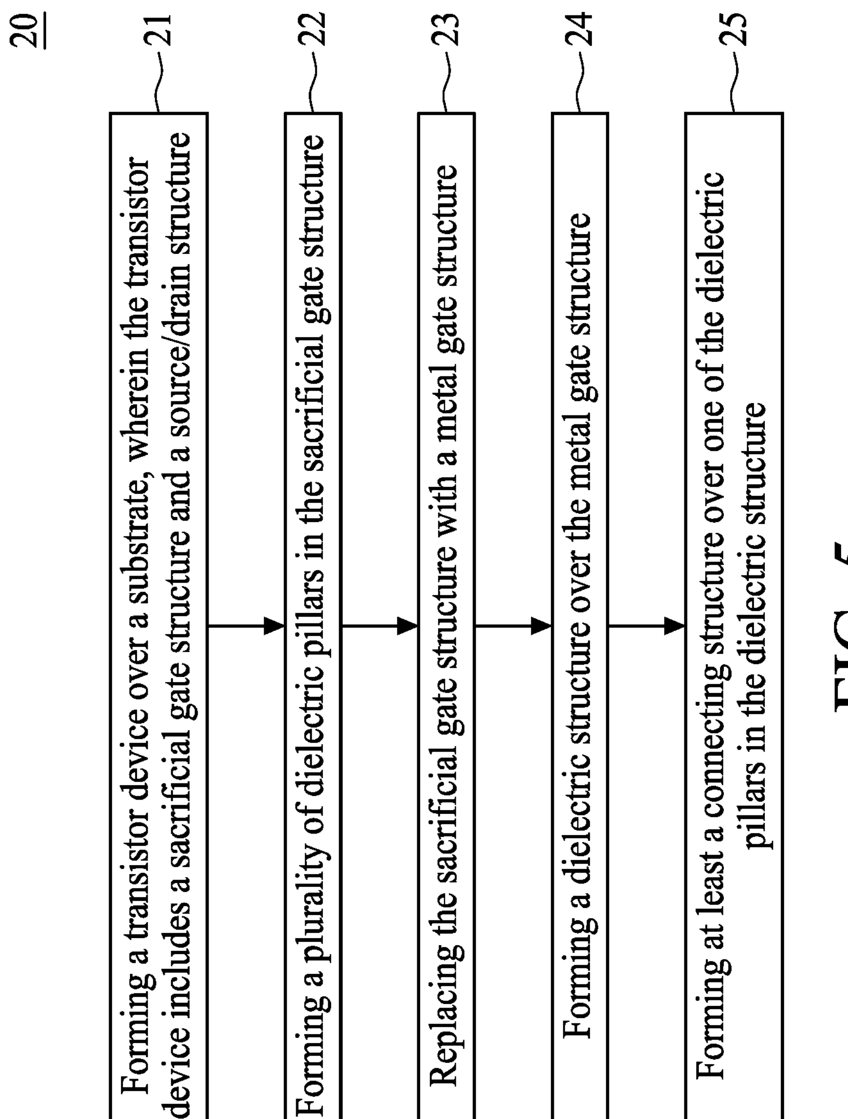
FIG. 5 is a flowchart representing a method for forming a semiconductor structure according to aspects of the present disclosure.

FIG. 5 is a flowchart representing a method for forming a semiconductor structure 20 according to aspects of the present disclosure. The method 20 includes a number of operations (21, 22, 23, 24 and 25). The method 20 will be further described according to one or more embodiments. It should be noted that the operations of the method 20 may be rearranged or otherwise modified within the scope of the various aspects. It should further be noted that additional processes may be provided before, during, and after the method 20, and that some other processes may be only briefly described herein. Thus, other implementations are possible within the scope of the various aspects described herein.

Figures 6, 7:
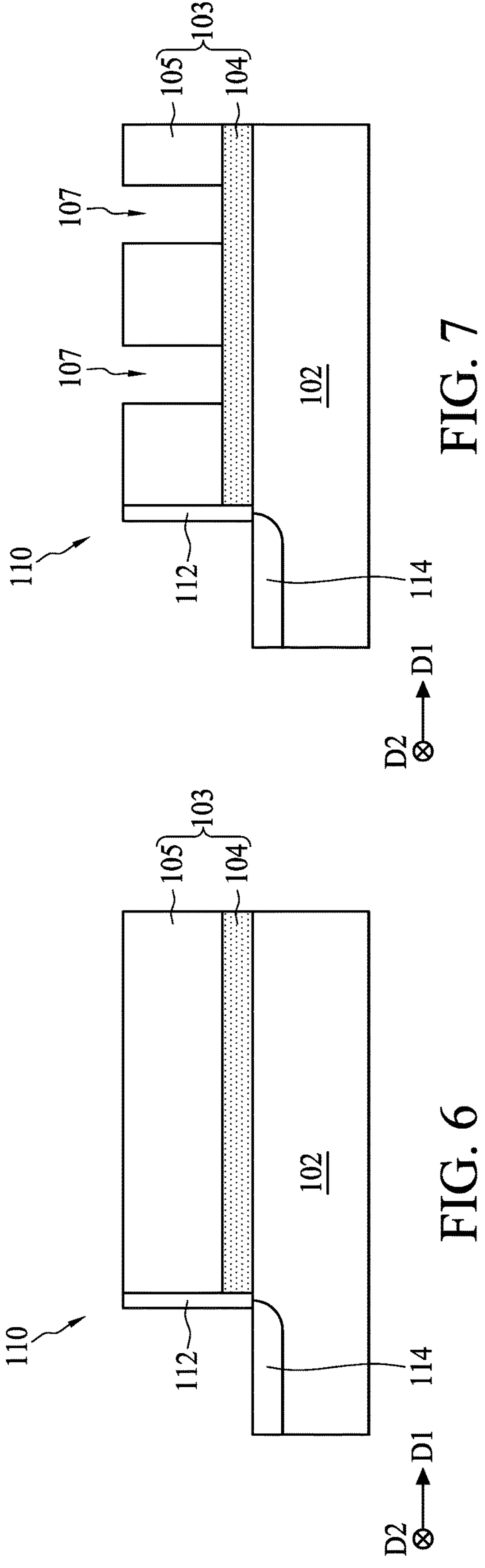
FIGS. 6 to 16C are cross-sectional show cross-sectional views illustrating a semiconductor structure at various fabrication stages according to aspects of the present disclosure in one or more embodiments.

FIGS. 6 to 16C are cross-sectional show cross-sectional views illustrating a semiconductor structure at various fabrication stages according to aspects of the present disclosure in one or more embodiments. It should be noted that same elements in FIGS. 1 to 16C are designated by same numerals, and may include same materials; therefore, repeated descriptions are omitted for brevity. Referring to FIG. 6, in operation 21, a transistor device 110 is formed over a substrate 102. As mentioned above, the substrate 102 may include isolation structures defining regions for accommodating various devices, though not shown. In some embodiments, the transistor device 110 includes a sacrificial gate structure 103. The sacrificial gate structure 103 includes a dielectric layer 104 and a sacrificial layer 105 formed over the dielectric layer 104. In some embodiments, the sacrificial layer 105 may include a sacrificial semiconductor (i.e., polysilicon) layer, but the disclosure is not limited thereto.

In some embodiments, the transistor device 110 includes spacers 112 disposed over sidewalls of the sacrificial gate structure 103. The transistor 110 further includes a source/drain structure 114 disposed in the substrate 102 at two sides of the sacrificial gate structure 103.

Figures 8, 9:
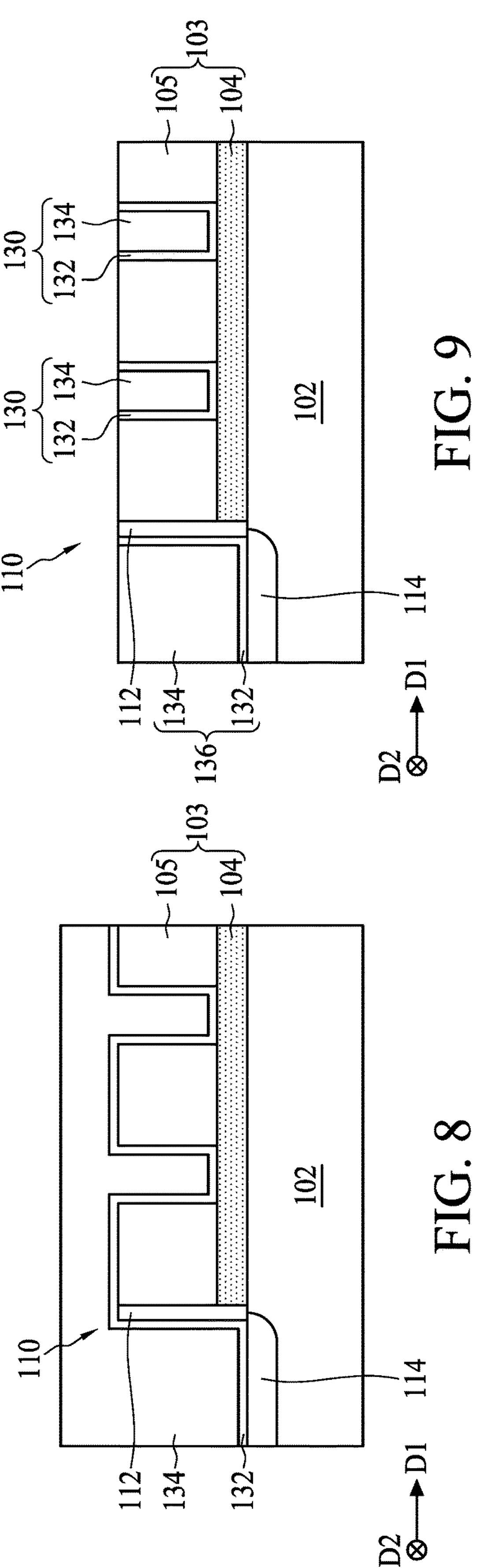

Referring to FIGS. 7 to 9, in operation 22, a plurality of dielectric pillars 130 are formed in the sacrificial layer 105. The operation 22 may include further operations. For example, as shown in FIG. 7, in some embodiments, an etching operation is performed to remove portions of the sacrificial gate structure 103 and thus to form a plurality of trenches 107 in the sacrificial gate structure 103. In some embodiments, portions of the sacrificial layer 105 are removed, and thus the trenches 107 are formed in the sacrificial gate structure 103 and separated from each other by the sacrificial layer 105. Further, portions of the dielectric layer 104 are exposed through bottoms of the trenches 107, as shown in FIG. 7. In some embodiments, the trenches 107 have a square shape, but the disclosure is not limited thereto. In some embodiments, widths and lengths of the trenches 107 are similar to each other, but the disclosure is not limited thereto. In some embodiments, the trenches 107 are periodically arranged, but the disclosure is not limited thereto. For example, the trenches 107 may be randomly arranged, though not shown.

Referring to FIG. 8, in some embodiments, a first dielectric layer 132 is conformally formed in each of the trenches 107 to cover sidewalls and bottoms of the trenches 107. Subsequently, a second dielectric layer 134 is formed to fill each of the trenches 107. Further, the first dielectric layer 132 covers sidewalls of transistor device 110 (i.e. the spacers 113) and a surface of the substrate 102. The second dielectric layer 134 fill vacancies over the substrate 102. A thickness of the first dielectric layer 132 is less than a thickness of the second dielectric layer 134. Further, materials for forming the first and second dielectric layers 132 and 134 are different from each other. For example, the first dielectric layer 132 may include silicon nitride or silicon oxynitride, while the second dielectric layer 134 may include silicon oxide, but the disclosure is not limited thereto.

Referring to FIG. 9, in some embodiments, a planarization operation such as a chemical-mechanical polishing (CMP) operation is performed to remove superfluous portions of the first dielectric layer 132 and the second dielectric layer 134 until a top surface of the sacrificial layer 105 is exposed. In such embodiments, the plurality of dielectric pillars 130 are formed in the sacrificial layer 105. In other words, the trenches 107 are filled with the dielectric pillars 130. Further, the dielectric pillars 130 are separated from each other by the sacrificial layer 105. In some embodiments, the first dielectric layer 132 serves as a contact etch stop layer (CESL), and the second dielectric layer 134 serves as an inter-layer dielectric (ILD) layer. In such embodiments, the CESL 132 and the ILD layer 134 form a dielectric structure 136 surrounding the sacrificial gate structure 103. In other words, the sacrificial gate structure 103 is embedded in the dielectric structure 136, as shown in FIG. 9.

Figure 11:
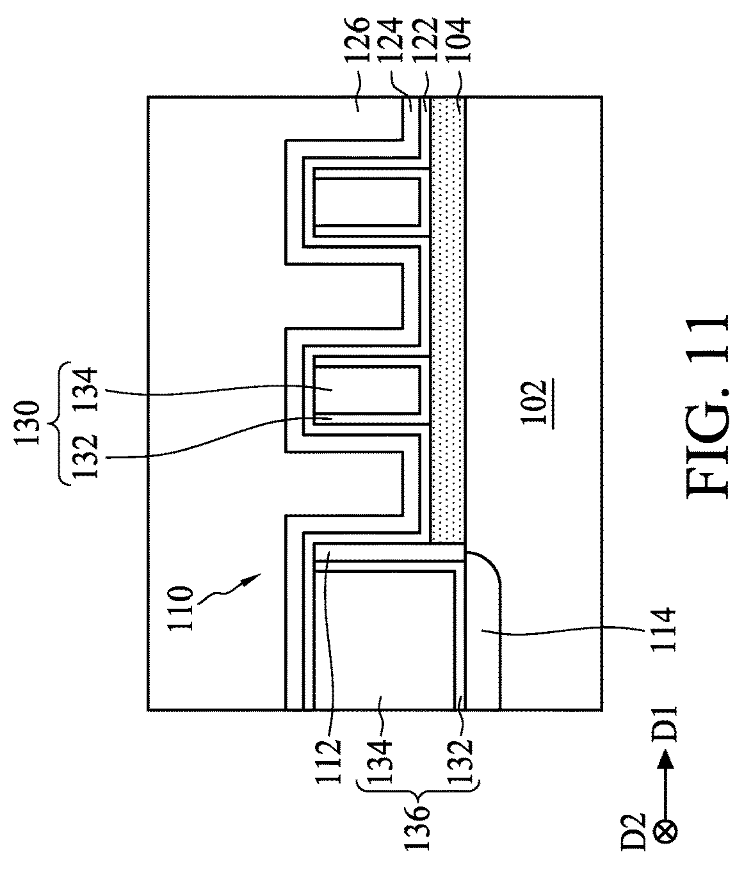
Figure 10:
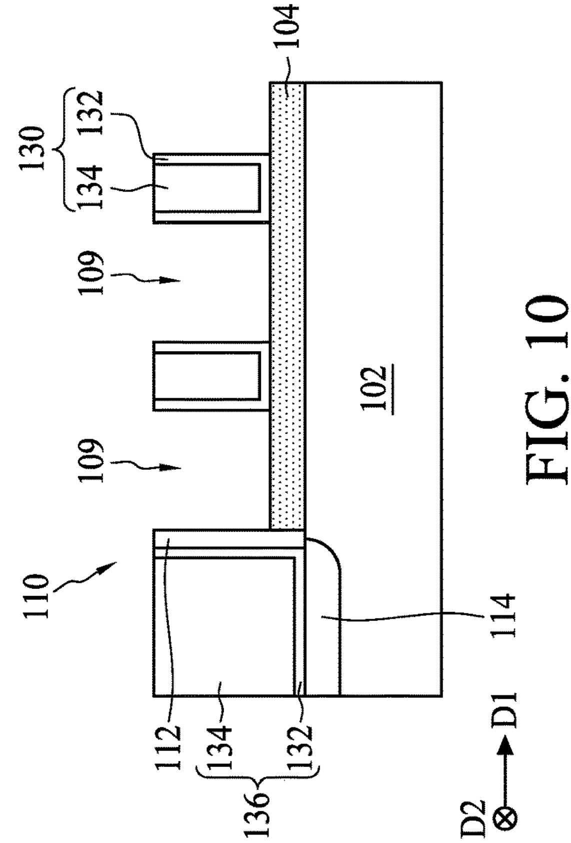
Figures 12, 13:
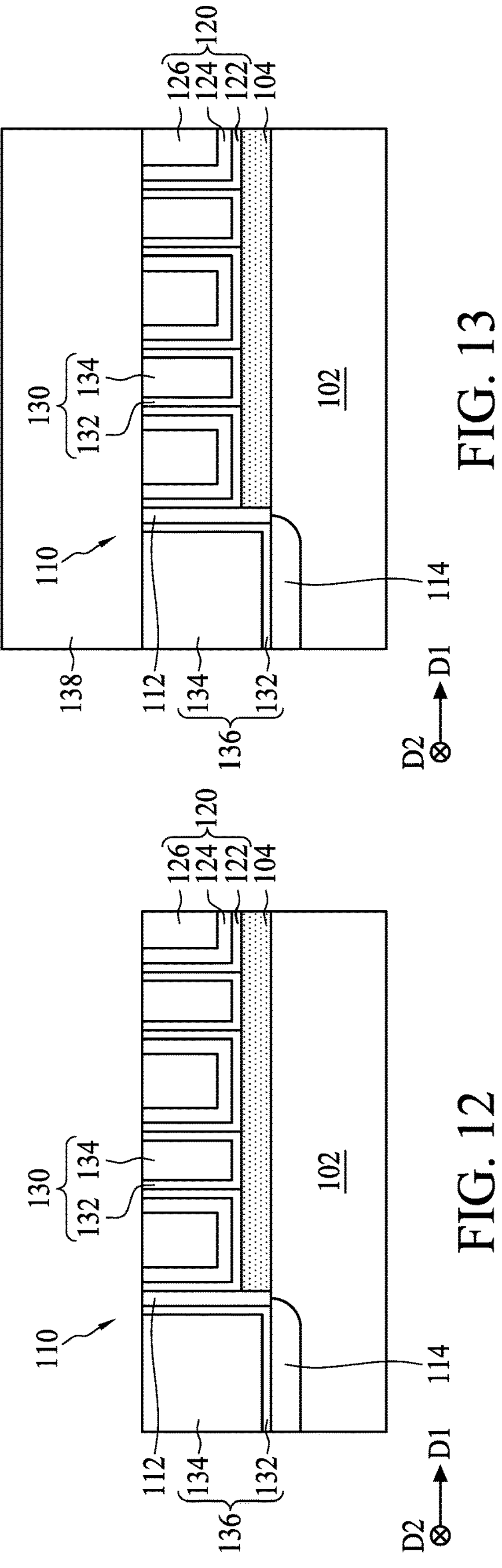

Referring to FIGS. 10 to 12, in operation 23, the sacrificial gate structure 103 is replaced with a metal gate structure 120. In some embodiments, the operation 23 includes further operations. For example, as shown in FIG. 10, portions of the sacrificial gate structure 103, such as a remainder of the sacrificial layer 105 is removed to form a trench 109 exposing the dielectric pillars 130. In some embodiments, the spacers 112 are exposed as sidewalls of the trench 109, and the dielectric pillars 130 stand upright in the trench 109.

Referring to FIG. 11, in some embodiments, a high-k gate dielectric layer 122 is conformally formed on a bottom and the sidewalls of the trench 109. After forming the high-k gate dielectric layer 122, at least a first metal layer 124 and a second metal layer 126 are sequentially formed over the high-k gate dielectric layer 122. The first metal layer 124 includes a work function metal layer, while the second metal layer 126 serves as a gap-filling metal layer.

Referring to FIG. 12, a planarization operation such as a CMP may be performed to remove superfluous layers. Accordingly, and portions of the high-k gate dielectric layer 122, portions of the work function metal layer 124, portions of the gap-filling metal layer 126 are removed. Thus, the metal gate structure 120 is formed. As shown in FIG. 12, the dielectric pillars 130 are separated from each other by the metal gate structure 120. A top surface of the metal gate structure 120 and top surfaces of the dielectric pillars 130 are aligned with each other.

It should be noted that during the planarization operation, the dielectric pillars 130 of the present disclosure help mitigate a dishing issue by reducing a polishing area of the gap-filling metal layer 126. Further, arrangements of the dielectric pillars 130 may be similar to those shown in FIGS. 1A, 2A, 3A and 4, but the disclosure is not limited thereto.

Referring to FIG. 13, in some embodiments, in operation 24, a dielectric structure 138 is formed over the substrate 102. As mentioned above, the dielectric structure 138 may include a multilayered structure, but the disclosure is not limited thereto.

Figures 14A, 14B:
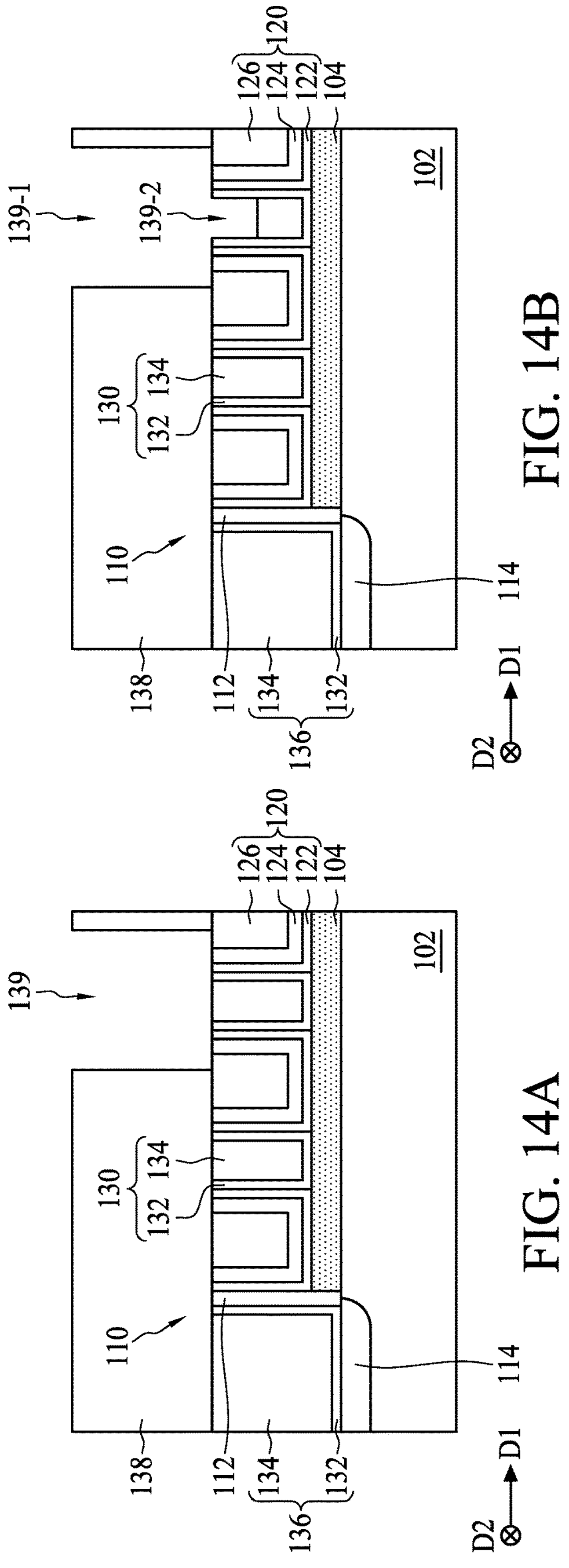
Figure 14C:
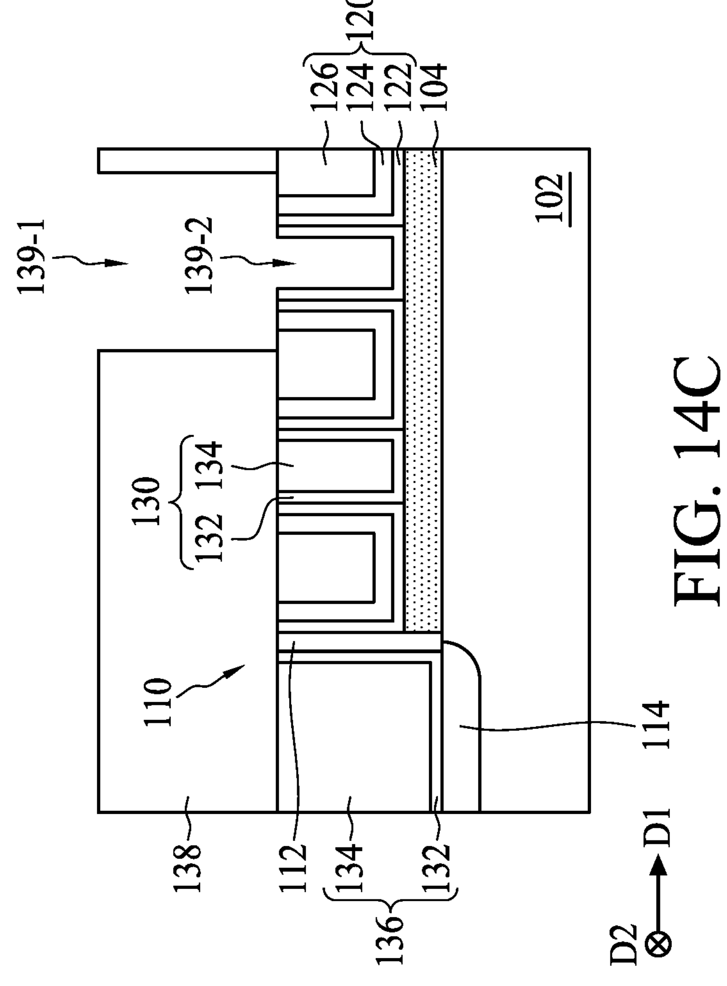

Referring to FIGS. 14A to 14C to FIGS. 16A to 16C, in some embodiments, in operation 25, at least a connecting structure 140 is formed over at least one of the dielectric pillars 130 in the dielectric structure 138. In some embodiments, the operation 25 includes further operations. For example, as shown in FIG. 14A, an etching operation is performed to remove at least a portion of the dielectric structure 138 to form a trench 139 in the dielectric structure 138. As shown in FIGS. 14A to 14C, a width of the trench 139 is greater than a width of the dielectric pillar 130. Thus, the top surface of the dielectric pillar 130 is entirely exposed through a bottom of the trench 139. In some embodiments, a portion of the metal gate structure 120 is exposed through the bottom of the trench 139. For example, a topmost surface of the high-k gate dielectric layer 122, a topmost surface of the work function metal layer 124 and a top surface of the gap-filling metal layer 126 are exposed through the bottom of the trench 139.

In some embodiments, a bottom surface of the trench 139 is aligned with the top surface of the metal gate structure 120, as shown in FIG. 14A.

In some embodiments, a portion of the dielectric pillar 130 is removed in the etching operation, thus forming a first opening 139-1 in the trench 139, and a second opening 139-2 under and coupled to the first opening 139-1, as shown in FIG. 14B. In such embodiments, the dielectric pillar 130 is exposed through a bottom of the second opening 139-2, and the CESL 132 serves as sidewalls of the second opening 139-2. A topmost surface of the CESL 132, the topmost surface of the high-k gate dielectric layer 122, the topmost surface the work function metal layer 124 and the top surface of the gap-filling metal layer 126 exposed through a bottom of the first opening 139-1 serve as sidewalls of the first opening 139-1 of the trench 139.

In some alternative embodiments, the dielectric pillar 130 exposed through the trench 139 is entirely removed such that the trench 139 has a first opening 139-1 and a second opening 139-2 under and coupled to the first opening 139-1, as shown in FIG. 14C. In such embodiments, the CESL 132 serves as a bottom and sidewalls of the second opening 139-2. The topmost surface of the CESL 132, the topmost surface of the high-k gate dielectric layer 122, the topmost surface off the work function metal layer 124 and the top surface of the gap-filling metal layer 126 are exposed through a bottom of the first opening 139-1, while the dielectric structure 138 serves as sidewalls of the first opening 139-1.

Figures 15A, 15B:
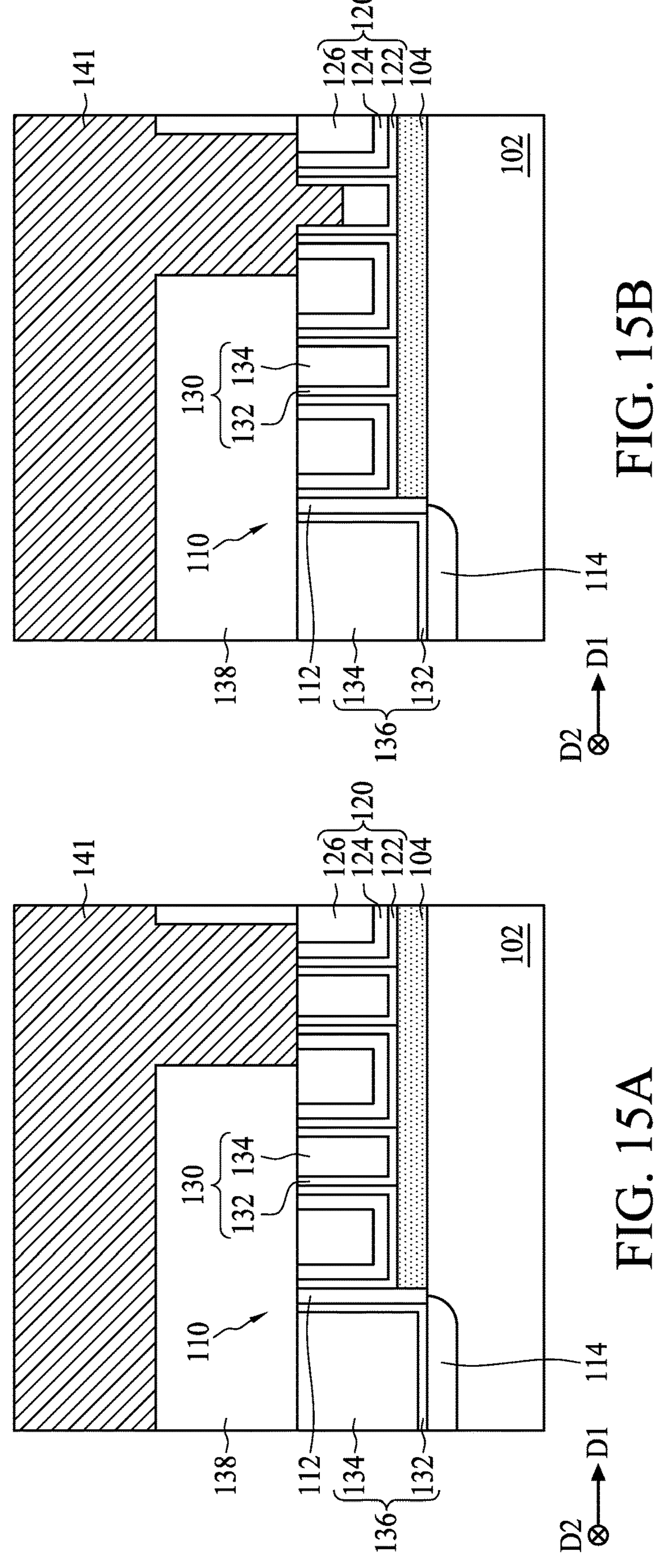
Figure 15C:
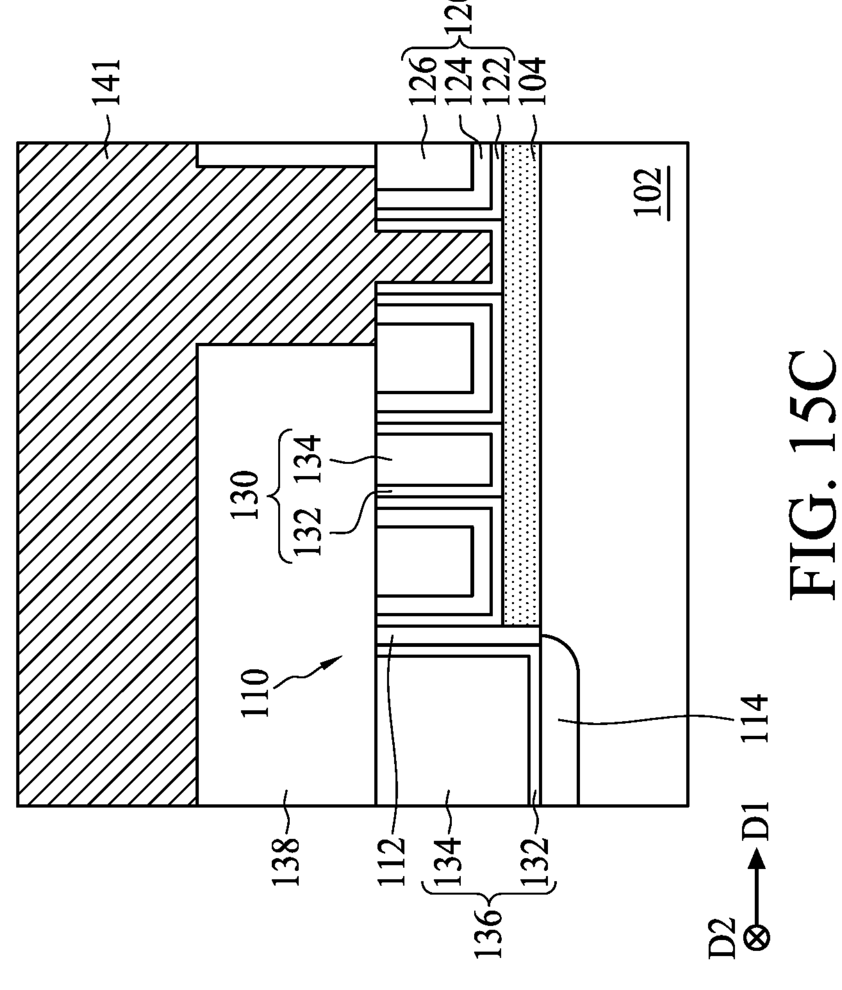

Referring to FIGS. 15A and 15C, in some embodiments, the operation 25 further include forming a conductive material 141 filling the trench 139.

Figures 16A, 16B:
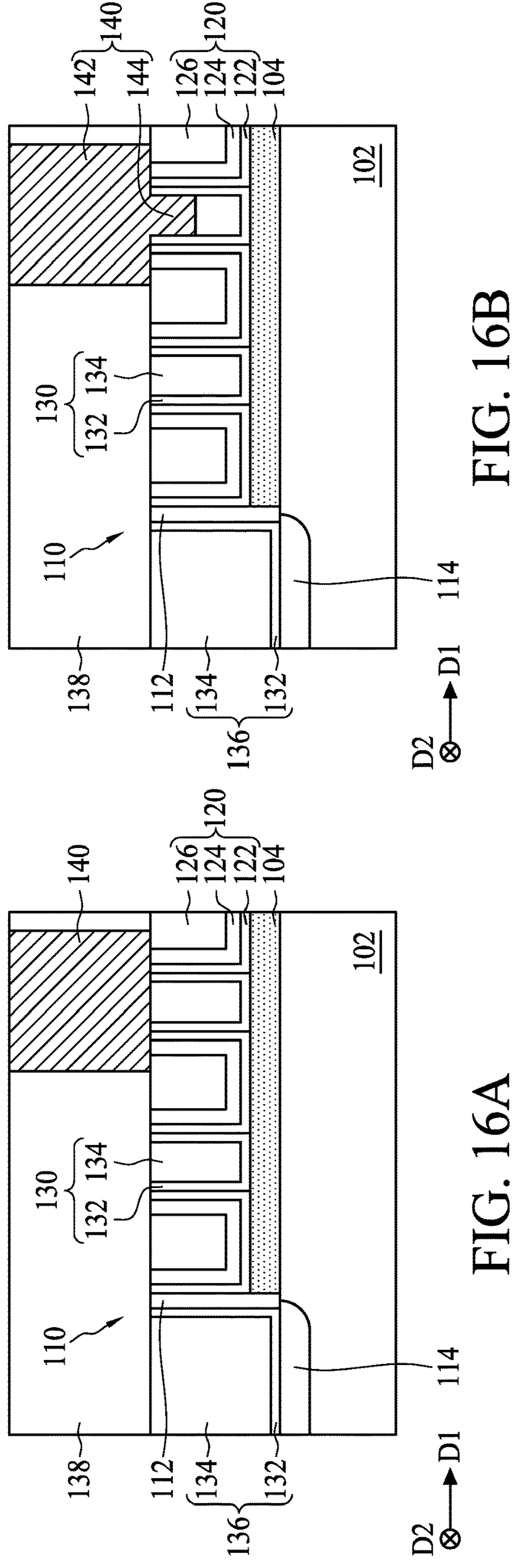
Figure 16C:
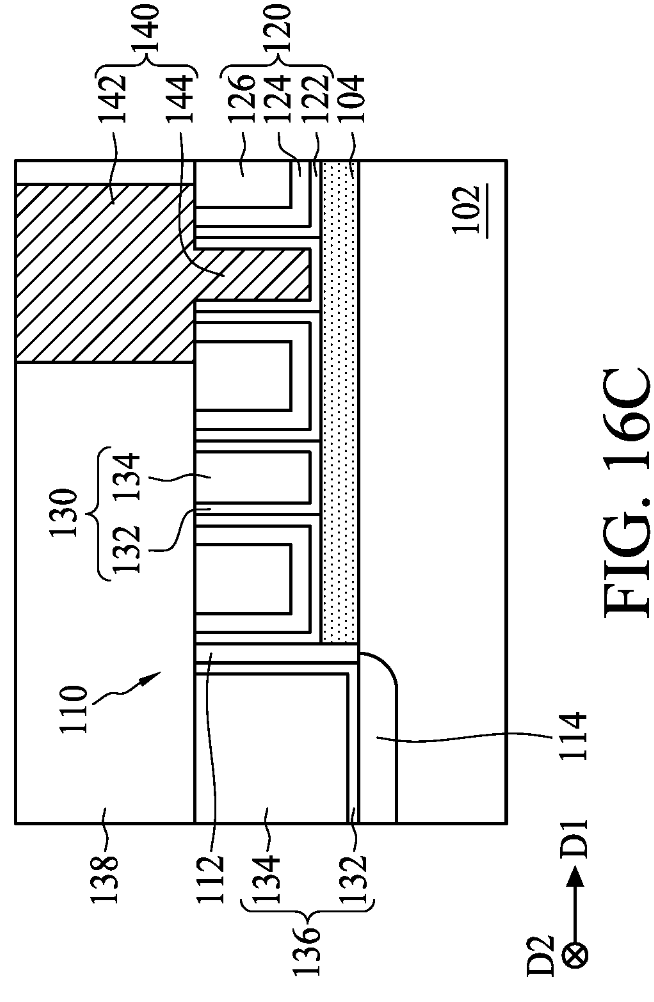

Referring to FIGS. 16A to 16C, in some embodiments, the operation 25 further includes performing a planarization to remove superfluous portions of the conductive material 141 to form the connecting structure 140 in the dielectric structure 138.

As shown in FIG. 16A, in some embodiments, the connecting structure 140 is disposed over the dielectric pillar 130. As mentioned above, the connecting structure 140 overlaps the dielectric pillar 130 entirely from a top view. An area of the connecting structure 140 is greater than an area of the dielectric pillar 130. Further, a bottom surface of the connecting structure 140 is aligned with the top surface of the metal gate structure 120 and a top surface of the dielectric structure 136. In other words, the bottom surface of the connecting structure 140 is aligned with a bottom surface of the dielectric structure 138.

As shown in FIG. 16B, in some embodiments, the connecting structure 140 includes a first portion 142 over the metal gate structure 120, and a second portion 144 over the dielectric pillar 130. Further, the second portion 144 is under the first portion 142. The first portion 142 and the second portion 144 are coupled to each other. A bottom of the second portion 144 of the connecting structure 140 is in contact with the dielectric pillar 130. Further, the bottom of the second portion 144 is lower than the top surface of the metal gate structure 120. The first portion 142 of the connecting structure 140 is in contact with the metal gate structure 120 and the second portion 144. Further, a bottom of the first portion 142 is in contact with the metal gate structure 120.

As shown in FIG. 16C, in some embodiments, the dielectric pillar 130 is replaced with the second portion 144 of the connecting structure 140. In such embodiments, the second portion 144 of the connecting structure 140 is in contact with the CESL 132. Further, the bottom of the first portion 142 is in contact with the metal gate structure 120. In some embodiments, it is referred to that at least one of the dielectric pillar 130 is replaced with the conductive pillar 144.

Figures 17A, 17B:
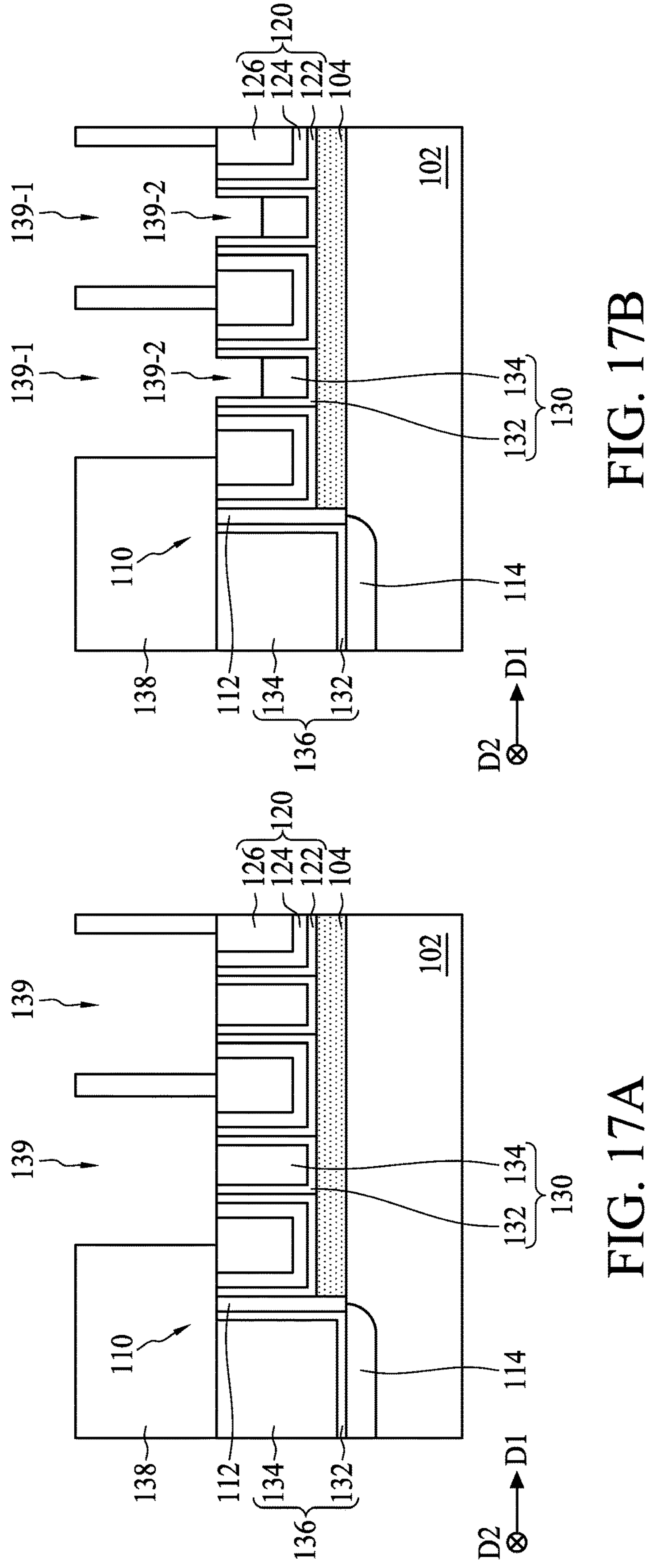
FIGS. 17A to 18C are cross-sectional show cross-sectional views illustrating a semiconductor structure at various fabrication stages according to aspects of the present disclosure in one or more embodiments.
Figure 17C:
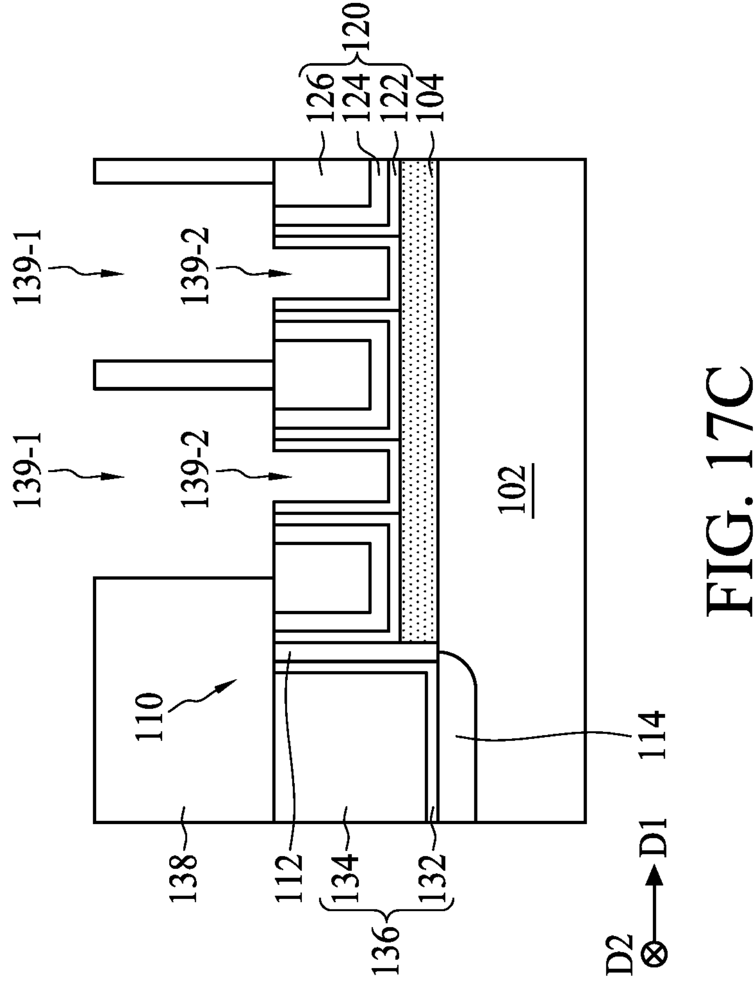

Referring to FIGS. 17A to 17C and FIGS. 18A to 18C, in some embodiments, the operation 25 includes further operations. For example, as shown in FIG. 17A, an etching operation is performed to remove portions of the dielectric structure 138 to form a plurality of trenches 139 in the dielectric structure 138. As shown in FIGS. 17A to 17C, a width of the trench 139 is greater than a width of the dielectric pillar 130. Further, the trenches 139 are separated from each other. In some embodiments, the top surface of the dielectric pillars 130 may be entirely exposed through a bottom of each trench 139. In some embodiments, a portion of the metal gate structure 120 is exposed through the bottom of each trench 139. In such embodiments, the work function metal layer 124 of the metal gate structure 120 is exposed though the bottom of each trench 139.

In some embodiments, the bottom surface of the trench 139 is aligned with the top surface of the metal gate structure 120, as shown in FIG. 17A. In some embodiments, a portion of the dielectric pillar 130 is removed in the etching operation, thus forming a first opening 139-1 in the trench 139, and a second opening 139-2 under and coupled to the first opening 139-1, as shown in FIG. 17B. In such embodiments, the dielectric pillar 130 is exposed through bottoms of the second openings 139-2 of the trenches 139, and the CESL 132 serves as sidewalls of the second openings 139-2 of the trenches 139, while the CESL 132, a portion of the high-k gate dielectric layer 122, a portion of the work function metal layer 124 and a portion of the gap-filling metal layer 126 are exposed through bottoms of the first openings 139-1, and the dielectric structure 138 serves as sidewalls of the first openings 139-1 of the trenches 139. In some alternate embodiments, the dielectric pillar 130 exposed through the trench 139 is entirely removed such that the trench 139 has a first opening 139-1 and a second opening 139-2 under and coupled to the first opening 139-1, as shown in FIG. 17C. In such embodiments, the CESL 132 serve as a bottom and sidewalls of the second opening 139-2 of the trench 139, while the CESL 132, a portion of the high-k gate dielectric layer 122, a portion of the work function metal layer 124 and a portion of the gap-filling metal layer 126 are exposed through a bottom of the first opening 139-1 of the trench 139, and the dielectric structure 138 serves as sidewalls of the first opening 139-1 of the trench 139.

The operation 25 further include forming a conductive material filling the trench 139.

Figures 18A, 18B:
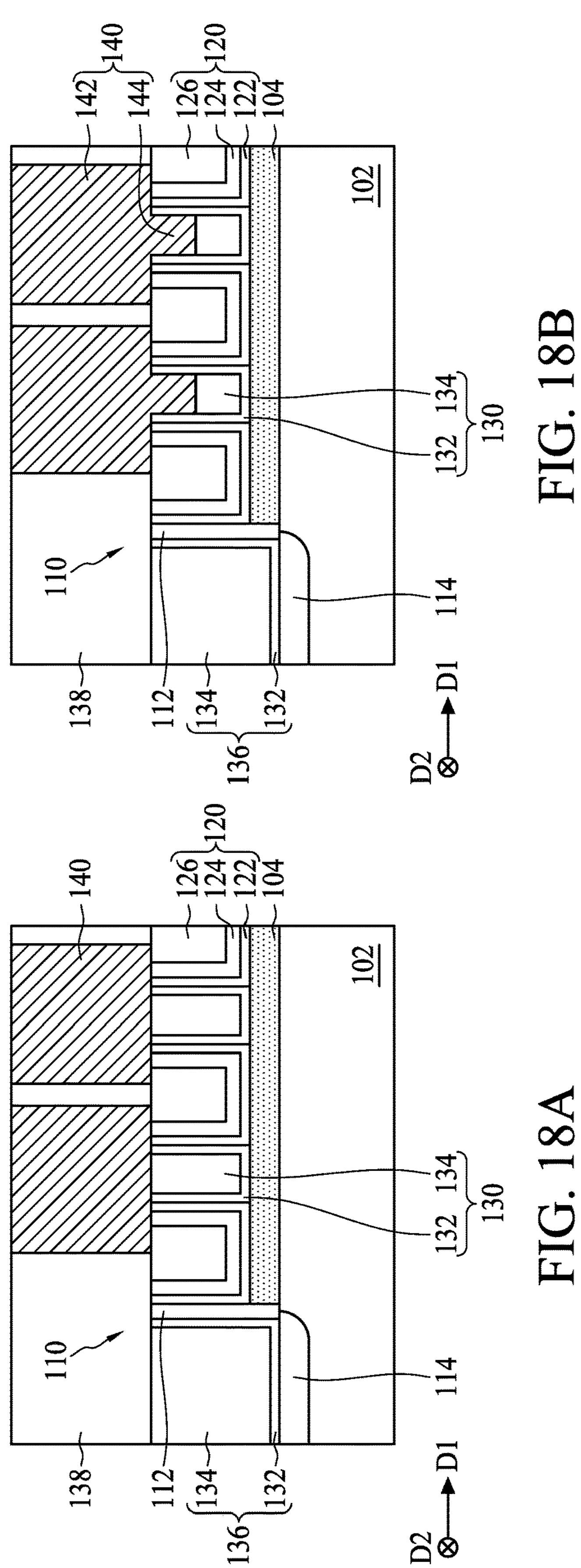
Figure 18C:
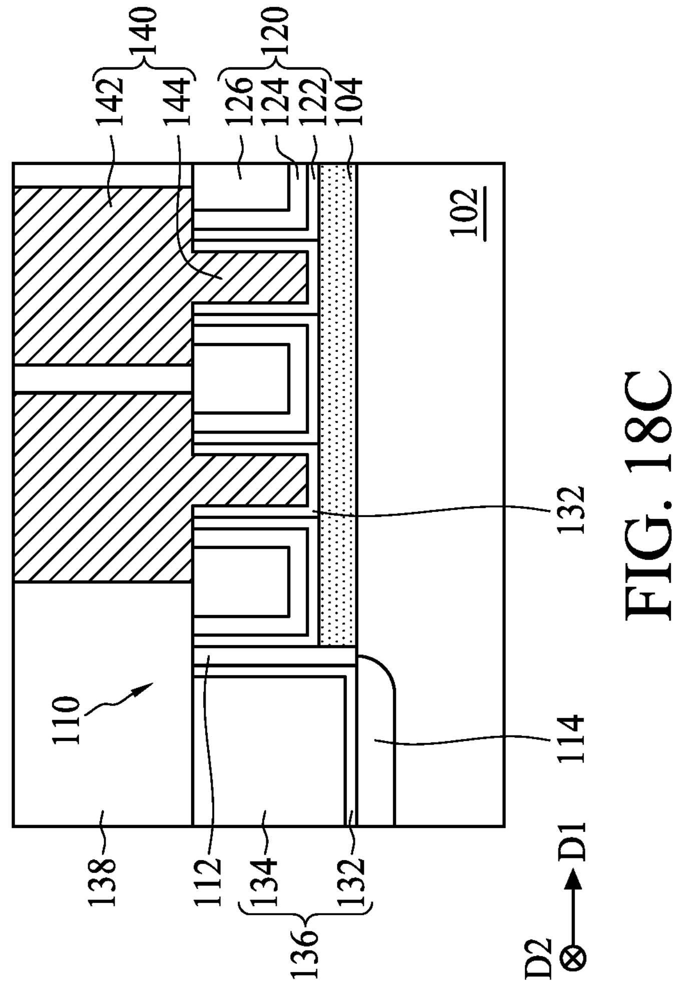

Referring to FIGS. 18A to 18C, in some embodiments, the operation 25 further includes performing a planarization to remove superfluous portions of the conductive material to form the connecting structures 140 in the dielectric structure 138. As shown in FIG. 18A, in some embodiments, the connecting structures 140 are disposed over the dielectric pillar 130. Further, the connecting structures 140 are separated from each other. The configuration and arrangement may be same as those described above; therefore, repeated descriptions are omitted for brevity.

In summary, embodiments of a method for forming a semiconductor structure are therefore provided. The semiconductor structure is formed in an HKMG process with multiple-Vt designs. The semiconductor structure can be formed in a planar device process according to some embodiments. Further, the semiconductor structure can be integrated in a non-planar device in some embodiments. In some embodiments, the method for forming the semiconductor structure includes providing connecting structures over a metal gate structure or in a metal gate structure of an HV device. In some embodiments, the HV device may be formed by HK-last processes, and thus the metal gate structure has a discontinuous configuration. However, the connecting structure over or in the metal gate structure resolves the discontinuity. Accordingly, a drive current loss issue is mitigated.

Some embodiments of the present disclosure provide a semiconductor structure. The semiconductor structure includes a metal gate structure, a plurality of dielectric pillars disposed in the metal gate structure, a source/drain structure disposed at two sides of the metal gate structure, and at least a first connecting structure disposed over one of the dielectric pillars and coupled to the metal gate structure. The first connecting structure overlaps the one of the dielectric pillars entirely from a top view. An area of the first connecting structure is greater than an area of the one of the dielectric pillars from the top view.

Some embodiments of the present disclosure provide a semiconductor structure. The semiconductor structure includes a metal gate structure, at least a conductive pillar disposed in the metal gate structure, a source/drain structure disposed at two sides of the metal gate structure, and at least a connecting structure disposed over the conductive pillar and coupled to the metal gate structure. The conductive pillar is separated from the metal gate structure. The connecting structure overlaps the conductive pillar entirely from a top view. An area of the connecting structure is greater than an area of the conductive pillar from the top view.

Some embodiments of the present disclosure provide a method for forming a semiconductor structure. The method includes following operations. A transistor device is formed over a substrate. The transistor device includes a sacrificial layer and a source/drain structure. A plurality of dielectric pillars are formed in the sacrificial gate structure. The sacrificial gate structure is replaced with a metal gate structure. A dielectric structure is formed over the metal gate structure. At least a connecting structure is formed over one of the dielectric pillars in the dielectric structure. The connecting structure overlaps the one of the dielectric pillars entirely from a top view. An area of the connecting structure is greater than an area of the one of the dielectric pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure comprising:

forming a transistor device over a substrate, wherein the transistor device comprises a sacrificial gate structure and a source/drain structure, and the sacrificial gate structure comprises a dielectric layer and a sacrificial layer over the dielectric layer;

forming a plurality of dielectric pillars in the sacrificial gate structure, wherein bottoms of the dielectric pillars are coupled to the dielectric layer of the sacrificial gate structure;

replacing the sacrificial gate structure with a metal gate structure;

forming a dielectric structure over the metal gate structure; and forming at least a connecting structure over one of the dielectric pillars in the dielectric structure, wherein the connecting structure overlaps the one of the dielectric pillars entirely from a top view, and an area of the connecting structure is greater than an area of the one of dielectric pillars.

2. The method of claim 1, wherein the forming of the dielectric pillars comprises:

removing portions of the sacrificial gate structure to form a plurality of trenches in the sacrificial gate structure; and filling the trenches with the dielectric pillars.

3. The method of claim 1, wherein replacing the sacrificial gate structure with the metal gate structure comprises:

removing portions of the sacrificial gate structure to form a trench surrounding the dielectric pillars;

forming a high-k gate dielectric layer in the trench;

forming a multilayered metal structure over the high-k gate dielectric layer in the second trench; and removing a portion of the multilayered metal structure and a portion of the high-k dielectric layer to form the metal gate structure, wherein a top surface of the metal gate structure is aligned with top surfaces of the dielectric pillars.

4. The method of claim 1, wherein the forming of the connecting structure further comprises:

forming at least a trench in the dielectric structure, wherein at least one of the dielectric pillars is entirely exposed through a bottom of the trench; and forming the connecting structure in the trench.

5. The method of claim 4, further comprising removing a portion of the one of the dielectric pillars exposed through the bottom of the trench to deepen the third trench.

6. A method for forming a semiconductor structure comprising:

forming a sacrificial gate structure over a substrate;

removing a portion of the sacrificial gate structure to form a first trench, wherein a depth of the first trench is less than a height of the sacrificial gate structure;

forming a dielectric pillar in the first trench;

forming a first dielectric structure laterally surrounding the sacrificial gate structure;

replacing the sacrificial gate structure with a metal gate structure;

forming a second dielectric structure over the metal gate structure; and removing a portion of the second dielectric structure to form a second trench exposing the dielectric pillar and a portion of the metal gate structure;

forming a connecting structure in the second trench, wherein the connecting structure is coupled to the dielectric pillar and the portion of the metal gate structure.

7. The method of claim 6, wherein the forming of the dielectric pillar and the forming of the first dielectric structure further comprises:

forming a first dielectric layer and a second dielectric layer in the first trench and over the substrate; and removing portions of the first dielectric layer and portions of the second dielectric layer to form the dielectric pillar and the first dielectric structure.

8. The method of claim 6, wherein a top surface of the dielectric pillar is aligned with a top surface of the first dielectric structure.

9. The method of claim 6, wherein a height of the first dielectric structure is greater than a height of the dielectric pillar.

10. The method of claim 6, wherein a width of the second trench is greater than a width of the dielectric pillar.

11. The method of claim 6, wherein a top surface of the dielectric pillar is exposed through a bottom of the second trench.

12. The method of claim 6, wherein the second trench comprises a first opening and a second opening under and coupled to the first opening, and a width of the first opening is greater than a width of the second opening.

13. The method of claim 12, wherein a bottom of the second opening is lower than a top surface of the metal gate structure.

14. A method for forming a semiconductor structure comprising:

forming a sacrificial gate structure over a substrate, wherein the sacrificial gate structure comprises a dielectric layer and a sacrificial layer over the dielectric layer;

forming a plurality of dielectric pillars in the sacrificial gate structure, wherein bottoms of the dielectric pillars are coupled to the dielectric layer of the sacrificial gate structure;

replacing the sacrificial gate structure with a metal gate structure;

forming a dielectric structure over the metal gate structure;

replacing one of the dielectric pillars with a conductive pillar; and forming at least a connecting structure in the dielectric structure, wherein the connecting structure is coupled to the conductive pillar and the metal gate structure.

15. The method of claim 14, wherein the forming of the plurality of dielectric pillars further comprises:

removing portions of the sacrificial gate structure to form a plurality of first trenches in the sacrificial gate structure; and forming a first dielectric layer and a second dielectric layer to fill the first trenches to form the dielectric pillars.

16. The method of claim 15, wherein the replacing of the at least one of the dielectric pillars with the conductive pillar further comprises:

removing a portion of the dielectric structure to form a second trench exposing the at least one of the dielectric pillars;

removing the second dielectric layer of the at least one of the dielectric pillars exposed through the second trench to form an opening under and coupled to the second trench; and forming the conductive pillar in the opening.

17. The method of claim 16, wherein a width of the second trench is greater than a width of the opening.

18. The method of claim 16, wherein the first dielectric layer is exposed through sidewalls and a bottom of the opening.

19. The method of claim 16, wherein the connecting structure is formed in the second trench.

20. The method of claim 16, wherein the conductive pillar is separated from the metal gate structure by the first dielectric layer.

* * * * *